(12) United States Patent
Ikeda et al.

(10) Patent No.: US 8,928,018 B2
(45) Date of Patent: Jan. 6, 2015

(54) LIGHT-EMITTING DEVICE AND MANUFACTURING METHOD THEREOF, LIGHTING DEVICE, AND DISPLAY DEVICE

(75) Inventors: Hisao Ikeda, Kanagawa (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 128 days.

(21) Appl. No.: 13/369,892

(22) Filed: Feb. 9, 2012

(65) Prior Publication Data
US 2012/0205678 A1 Aug. 16, 2012

(30) Foreign Application Priority Data

Feb. 11, 2011 (JP) ................................ 2011-028004

(51) Int. Cl.
| H01L 33/00 | (2010.01) |
| H01L 21/00 | (2006.01) |
| H01L 27/32 | (2006.01) |
| H01L 51/52 | (2006.01) |

(52) U.S. Cl.
CPC ........ H01L 27/3276 (2013.01); H01L 51/5203 (2013.01); H01L 51/5212 (2013.01); H01L 51/5228 (2013.01); H01L 27/3246 (2013.01); H01L 2251/5361 (2013.01)
USPC ............................................. 257/98; 438/22

(58) Field of Classification Search
CPC ..... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50
USPC ............ 257/13, 79–103, 918; 438/22–47, 69, 438/493, 503, 507, 56
See application file for complete search history.

(56) References Cited

U.S. PATENT DOCUMENTS

| 6,037,712 | A | 3/2000 | Codama et al. |
| 6,222,315 | B1 | 4/2001 | Yoshizawa et al. |
| 6,280,861 | B1 | 8/2001 | Hosokawa et al. |
| 6,306,559 | B1 | 10/2001 | Tanamura et al. |
| 7,161,184 | B2 | 1/2007 | Miyagi et al. |
| 7,834,543 | B2 | 11/2010 | Takata |
| 7,888,864 | B2 | 2/2011 | Young |
| 7,943,938 | B2 | 5/2011 | Miyagi et al. |

(Continued)

FOREIGN PATENT DOCUMENTS

| JP | 2005-235491 | 9/2005 |
| JP | 2009-130132 | 6/2009 |
| WO | WO 2004/044987 A2 | 5/2004 |

*Primary Examiner* — Chuong A Luu
*Assistant Examiner* — Moin Rahman
(74) *Attorney, Agent, or Firm* — Husch Blackwell LLP

(57) ABSTRACT

In a light-emitting device, an insulating separation layer whose upper portion protrudes more than a bottom portion in a direction parallel to a substrate is provided on and in contact with a common wiring provided over the substrate. An EL layer provided over the separation layer on the common wiring is physically divided by the separation layer. An upper electrode layer formed in the same position is also physically divided by the separation layer and is in contact with the common wiring in a region overlapped with the most protruding portion of the separation layer. Such a common wiring may be used as an auxiliary wiring. Further, such a light-emitting device may be applied to a lighting device and a display device.

19 Claims, 15 Drawing Sheets

(56) References Cited

U.S. PATENT DOCUMENTS

| | | |
|---|---|---|
| 7,999,463 B2 | 8/2011 | Nomura |
| 2003/0060055 A1 | 3/2003 | Kamijima |
| 2008/0116788 A1* | 5/2008 | Yamazaki et al. ............ 313/504 |
| 2008/0286445 A1* | 11/2008 | Suzuki et al. .................. 427/64 |
| 2009/0058278 A1* | 3/2009 | Ushikubo et al. ............. 313/504 |
| 2009/0153046 A1* | 6/2009 | Hayashi et al. ............... 313/505 |
| 2010/0301326 A1* | 12/2010 | Miyairi et al. .................. 257/43 |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2011/0210335 A1 | 9/2011 | Miyagi et al. |
| 2012/0161165 A1 | 6/2012 | Yamazaki |
| 2012/0161166 A1 | 6/2012 | Yamazaki |
| 2012/0161167 A1 | 6/2012 | Yamazaki |
| 2012/0161174 A1 | 6/2012 | Yamazaki |

* cited by examiner 107 105 131 111 109 103

107 105 133 111 109 103

107 105   111 109 103

107 105   123      103

107 105   123   103 125

107 105   123 103  125

LIGHT-EMITTING DEVICE AND MANUFACTURING METHOD THEREOF, LIGHTING DEVICE, AND DISPLAY DEVICE

BACKGROUND OF THE INVENTION

1. Field of the Invention

The present invention relates to a light-emitting device and a manufacturing method thereof. Further, the present invention relates to a lighting device and a display device.

2. Description of the Related Art

An organic EL element has been actively researched and developed. In the fundamental structure of the organic EL element, a layer containing a light-emitting organic compound is interposed between a pair of electrodes. By applying voltage to this element, light emission from the light-emitting organic compound can be obtained.

Further, a display device in which an organic EL element and a thin film transistor are combined has been actively developed. A display device including an organic EL element does not need a backlight which is necessary for a liquid crystal display device, so that a reduction in thickness and an increase in luminance and contrast can be achieved.

The organic EL element can be formed into a film shape; thus, a large-area element can easily be formed. Therefore, the organic EL element has a high utility value as a surface light source that can be applied to lighting or the like.

For example, a lighting device including an organic. EL element is disclosed in Patent Document 1.

As for an organic EL element, there are a bottom emission type in which light emission is extracted to a lower electrode layer side, a top emission type in which light emission is extracted to an upper electrode layer side, and a dual emission type in which light emission is extracted to a lower electrode layer side and an upper electrode layer side.

REFERENCE

Patent Document

[Patent Document 1] Japanese Published Patent Application No. 2009-130132

SUMMARY OF THE INVENTION

As a method for stacking a layer containing an organic compound and an upper electrode layer in that order over a lower electrode layer formed over a substrate having an insulating surface in forming an EL element, a vacuum evaporation method is given, for example. As a method for forming an island-shaped layer using a vacuum evaporation method, a method using a metal mask (also referred to as a shadow mask), which is a metal plate provided with an opening, is known. The metal mask is provided between a substrate and an evaporation source to be in contact with the substrate, and evaporation is performed on the substrate through the opening in the metal mask, whereby a film having a shape in accordance with the shape of the opening can be formed. Note that when the distance between a metal mask and a substrate is short, an island-shaped layer can be formed with a clear shape based on an opening; in other words, a shape whose periphery is less obscure.

On the other hand, the probability of the occurrence of problems becomes high when a metal mask is used in contact with a substrate. For example, a surface of the substrate is damaged by an edge of an opening portion in the metal mask in some cases. Specifically, at the time of making the metal mask to be in contact with the substrate, the metal mask rubs the surface of the substrate, so that another layer, which has already been formed on the substrate, is broken in some cases. Further, dust attached to the metal mask (including a small foreign substance referred to as a particle) is transferred from the metal mask to the substrate in some cases.

A method is known in which in a display device having a plurality of pixel portions each including an EL element, light emitted from the EL element is white light and the light is extracted to the outside through a color filter. As described above, when all of the EL elements emit white light, a metal mask for separately forming EL layers for different colors in the pixel portions is not needed and the EL layers can be formed with only one metal mask, which is preferable.

However, even in the case of the EL element which emits white light, in order that a common wiring provided over a substrate in advance and an upper electrode layer of the EL element are connected to each other, at least two metal masks, i.e., a metal mask for forming the EL layer and a metal mask for forming the upper electrode layer are needed so that the EL layer is not formed in a connection portion between the common wiring and the upper electrode layer.

Therefore, in an in-line deposition apparatus, an exchange chamber for exchanging metal masks needs to be provided between a deposition chamber for forming an EL layer and a deposition chamber for forming an upper electrode layer, which, causes problems in that a process becomes complex, the apparatus becomes complicated, cycle time is increased, and the like.

As the area of a light-emitting portion in a lighting device or a display device having a large screen increases, a potential drop due to the resistance of an upper electrode layer or a lower electrode layer of an EL element tends to be significant. In the case where a potential drop in the electrode layer is significant, there is a problem in that gradation in luminance might be seen. In order to prevent such a problem, an auxiliary electrode formed using a material having low resistivity needs to be connected to the electrode layer.

In particular, a light-transmitting conductive material which is used for a transparent electrode has relatively high resistance; therefore, a demand for providing an auxiliary wiring is high. The auxiliary wiring should be provided so that the auxiliary wiring blocks as little light emitted from an EL element as possible. However, particularly in the case of a top emission type (including a dual emission type) in which light is extracted to an upper electrode layer side, the auxiliary wiring needs to be formed after formation of an EL element; accordingly, the EL element might be damaged in some cases. For example, in the case where processing is performed by a photolithography method after a conductive film is formed by a sputtering method, thermal and physical damage caused by the sputtering method, optical and thermal damage caused by the photolithography method, melting of the EL element due to an organic solvent or the like in removal of a resist, or the like can be given.

The present invention is made in view of the foregoing technical background. Accordingly, an object is to provide a light-emitting device having a structure in which the number of metal masks used for forming an EL layer and an upper electrode layer can be reduced and a manufacturing method thereof. Further, an object is to provide a highly reliable light-emitting device in which a potential drop due to the resistance of the upper electrode layer is suppressed. Furthermore, an object is to provide a lighting device and a display device including such a light-emitting device.

The present invention achieves at least one of the above objects.

In order to achieve the above objects, the present invention focuses on a structure of a common wiring connected to the upper electrode layer. The common wiring included in the light-emitting device is provided over a substrate, and an insulating separation layer in which an upper portion protrudes more than a bottom portion in a direction parallel to the substrate is provided on and in contact with the common wiring. An EL layer formed in a region including the separation layer on the common wiring is physically divided by the separation layer. An upper electrode layer formed in the same region over the EL layer is also physically divided by the separation layer and is electrically connected to the common wiring in a region overlapped with the protruding portion of the separation layer. Further, such a common wiring may be used as an auxiliary wiring. Furthermore, a light-emitting device including such a common wiring may be applied to a lighting device and a display device.

A common wiring provided with the separation layer having such a structure and a contact portion between the common wiring and an upper electrode layer are provided for a light-emitting device, whereby an EL layer and an upper electrode layer can be formed with one metal mask having an opening portion over a light-emitting region and the separation layer. Accordingly, unlike in the conventional art, different metal masks are not needed for forming the EL layer and for forming the upper electrode layer. Thus, a problem caused due to contact between a metal mask and a substrate can be suppressed, and a highly reliable light-emitting device, and a highly reliable display device and lighting device each including the light-emitting device can be provided. Furthermore, since the number of metal masks is reduced, manufacturing cost for metal masks and steps can be reduced.

In other words, a light-emitting device according to an embodiment of the present invention includes a lower electrode layer over a substrate, a common wiring electrically isolated from the lower electrode layer, a separation layer which covers at least part of the common wiring, an EL layer over the lower electrode layer, and an upper electrode layer over the EL layer. The separation layer has an insulating property and includes a side portion which protrudes more than a bottom portion of the separation layer in a direction parallel to a surface of the substrate. The upper electrode layer is electrically connected to the common wiring in a region overlapped with the separation layer.

A light-emitting device according to an embodiment of the present invention includes a separation layer over a common wiring connected to an upper electrode layer of an EL element. The separation layer is formed so that a contact surface of a bottom portion of the separation layer is inside an area projected on a substrate surface. The separation layer having such a shape is provided over the common wiring, whereby the EL layer and the upper electrode layer can be formed with one metal mask having an opening portion over a light-emitting region and the separation layer or without a metal mask. An end portion of the upper electrode layer is formed in contact with a surface of the common wiring overlapped with the protruding region of the separation layer, whereby the upper electrode layer and the common wiring can be electrically connected to each other.

In a light-emitting device according to an embodiment of the present invention, a common wiring provided with the separation layer can be used as an auxiliary wiring for supporting conductivity of an upper electrode layer. Part of the upper electrode layer is in contact with the common wiring in a region overlapped with the separation layer, so that upper electrode layers in different light-emitting elements can be electrically connected to each other through a common wiring serving as an auxiliary wiring.

With a contact portion and an auxiliary wiring, a highly reliable light-emitting device in which a potential drop due to the resistance of an upper electrode layer is suppressed can be provided. Further, an EL layer and an upper electrode layer can be formed with one metal mask or without a metal mask.

In a light-emitting device according to another embodiment of the present invention, a portion of an upper electrode layer, which is in contact with a common wiring, is thinner than a portion of the upper electrode layer, which overlaps with a lower electrode layer in a light-emitting region.

When the contact portion of the upper electrode layer is thin, the contact area can be increased even in the case where a gap between a side surface of the separation layer and the common wiring is small; thus, contact resistance can be reduced and a highly reliable light-emitting device can be provided.

A light-emitting device according to another embodiment of the present invention is characterized in that in a cross section perpendicular to the substrate, there is a space between a side surface of the separation layer and a line connecting the outermost point in a bottom portion of the separation layer and the most protruding point in a side surface of the separation layer.

When there is a space between a side surface of the separation layer and a line connecting the outermost point in a bottom portion of the separation layer and the most protruding point in a side surface of the separation layer in a cross section perpendicular to the substrate, an EL layer and an upper electrode layer can be prevented from being formed on a side surface of the separation layer, and thus, the EL layer and the upper electrode layer can be effectively divided.

In a light-emitting device according to another embodiment of the present invention, an upper electrode layer transmits light emitted by an EL layer, and a lower electrode layer reflects the light.

In particular, in a top-emission light-emitting device in which a light-transmitting material is used for an upper electrode layer, the contact portion and the common wiring serving as an auxiliary wiring are provided, so that conductivity of the upper electrode layer can be effectively increased.

Another embodiment of the present invention is a lighting device including the light-emitting device.

A display device which is one mode of a light-emitting device includes a pixel portion connected to the common wiring having the above structure. In a display device having such a structure, an EL layer and an upper electrode layer can be formed with one metal mask having an opening portion over a light-emitting region and the separation layer or without a metal mask; thus, a highly reliable display device can be provided.

In particular, in a top-emission light-emitting device in which a light-transmitting material is used for an upper electrode layer, the common wiring is used as an auxiliary wiring for supporting conductivity of the upper electrode layer, so that the conductivity of the upper electrode layer can be effectively supported. In particular, in a display device, a circuit including a transistor is provided closer to a substrate than an EL element is to the substrate; therefore, the aperture ratio can be increased in the case where a top emission type is employed.

Another embodiment of the present invention is a lighting device including the light-emitting device.

When a lighting device includes the light-emitting device in which an EL layer and an upper electrode layer can be formed with one metal mask having an opening portion over a light-emitting region and a separation layer or without a metal mask, the lighting device can be highly reliable.

A method for manufacturing a light-emitting device, according to an embodiment of the present invention, includes the steps of: forming a lower electrode layer over a substrate; forming a common wiring; forming an insulating separation layer which overlaps with at least part of the common wiring and has a side portion in which an upper portion protrudes more than a bottom portion in a direction parallel to a surface of the substrate; forming an EL layer over the lower electrode layer; and forming an upper electrode layer over the EL layer so as to be electrically connected to the common wiring.

According to the above method, the EL layer and the upper electrode layer can be formed with one metal mask or without a metal mask, so that a highly reliable light-emitting device can be manufactured.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

Note that in this specification and the like, a wiring which is electrically connected to an upper electrode layer included in an EL element is referred to as a common wiring.

According to an embodiment of the present invention, a light-emitting device having a constitution in which the number of metal masks used for forming an EL layer and an upper electrode layer can be reduce and a manufacturing method thereof can be provided. Further, a highly reliable light-emitting device in which a potential drop due to the resistance of the upper electrode layer is suppressed can be provided. Furthermore, a lighting device and a display device including such a light-emitting device can be provided.

BRIEF DESCRIPTION OF THE DRAWINGS

In the accompanying drawings.

DETAILED DESCRIPTION OF THE INVENTION

Figure 1A:
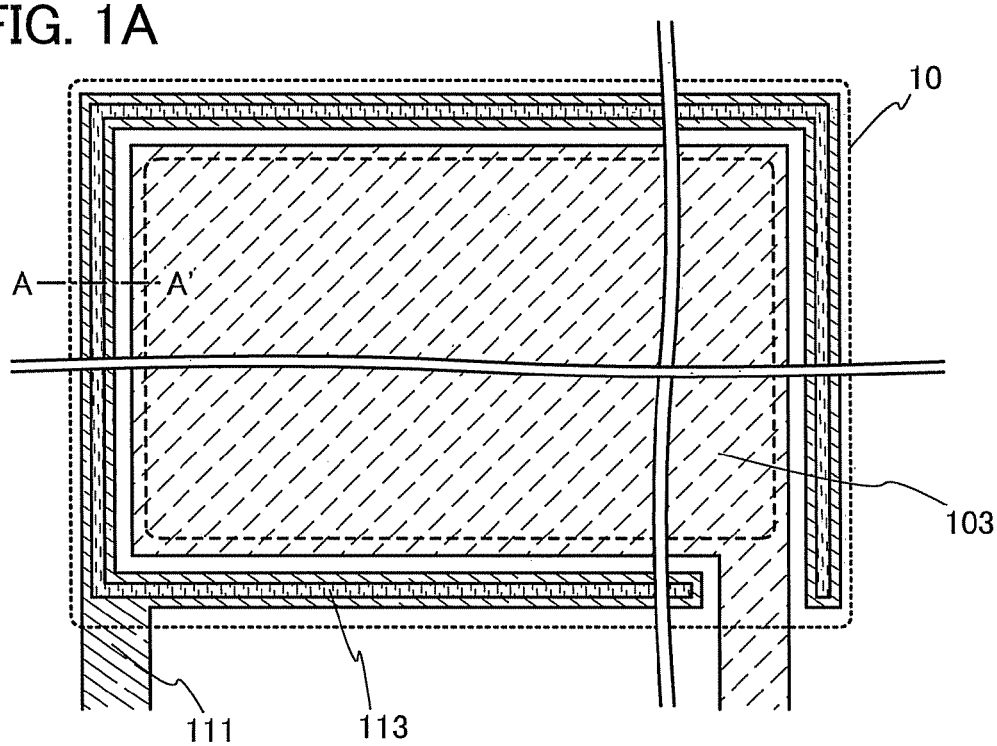
FIGS. 1A and 1B illustrate a light-emitting device according to an embodiment of the present invention.

Embodiments will be described in detail with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

In this embodiment, an example of a light-emitting device which is an embodiment of the present invention and a manufacturing method thereof will be described with reference to FIGS. 1A and 1B, FIGS. 2A to 2C, FIGS. 3A to 3D, FIGS. 4A to 4C, and FIGS. 5A to 5C.

Structural Example 1

Figure 1B:
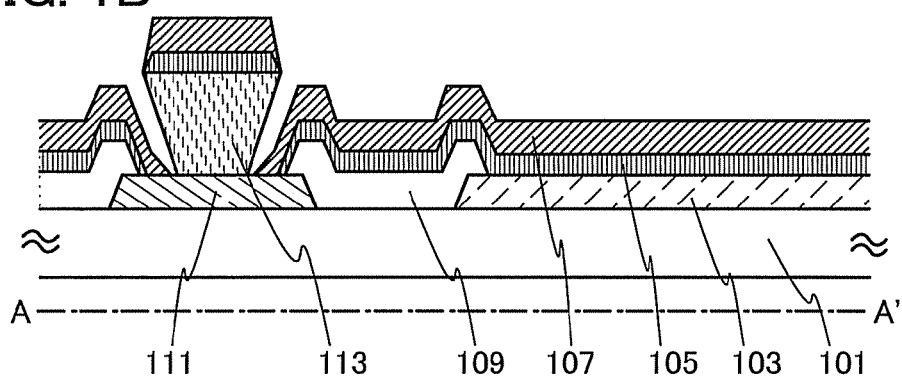

FIG. 1A is a schematic top view of a light-emitting device 10. FIG. 1B is a schematic cross-sectional view taken along line A-A' in FIG. 1A. Note that an EL layer and an upper electrode layer are not illustrated in FIG. 1A for simplicity.

The light-emitting device 10 includes, over a substrate 101, a lower electrode layer 103, an EL layer 105, an upper electrode layer 107, a partition 109, and a common wiring 111. Further, a separation layer 113 is provided over the common wiring 111.

Although not illustrated, the light-emitting device 10 may include a base film which is in contact with the substrate 101 and a sealing film which covers the upper electrode layer 107. With the base film and the sealing film, deterioration of the EL layer can be suppressed, and thus, the reliability of the light-emitting device 10 can be increased.

In the light-emitting device 10, voltage is applied to a light-emitting element which includes the lower electrode layer 103, the upper electrode layer 107, and the EL layer 105 sandwiched therebetween, so that light emission can be obtained.

The partition 109 is formed at end portions of the lower electrode layer 103 and the common wiring 111. The partition 109 is provided at the end portions of the lower electrode layer 103 and the common wiring 111 in order to prevent each the EL layer 105 and the upper electrode layer 107 from being disconnected at the steps of the lower electrode layer 103 and the common wiring 111. Therefore, the partition 109 preferably has a forward tapered shape so that a film formed thereover is not disconnected. In the forward tapered shape, a layer gradually increases in thickness from its upper edge and is in contact with a layer serving as a base in a cross section.

The common wiring 111 is provided to surround the lower electrode layer 103 and is feinted using a conductive material having sufficiently lower resistance than at least a material of the upper electrode layer 107. Further, the separation layer 113 is provided on and in contact with the common wiring 111.

The separation layer 113 has an insulating property and an upper portion thereof protrudes in a direction parallel to a surface of the substrate 101. In other words, when the separation layer 113 is projected on the surface of the substrate, the area which is in contact with the common wiring 111 is smaller than the projected area and is provided inside the projected area.

The separation layer 113 having such a shape is provided and the EL layer 105 and the upper electrode layer 107 are formed by methods described later, so that as illustrated in FIG. 1B, the EL layer 105 is divided by the separation layer 113. Further, the upper electrode layer 107 is in contact with a top surface of the common wiring 111 in a region overlapped with the protruding portion of the separation layer 113 and is electrically connected to the common wiring 111.

Accordingly, the upper electrode layer 107 is electrically connected to the common wiring 111 surrounding the lower electrode layer 103, so that a common potential can be applied to the upper electrode layer 107 through the common wiring 111.

Here, the EL layer 105 and the upper electrode layer 107 can be formed using one metal mask having an opening portion over the lower electrode layer 103 and the common wiring 111. The separation layer 113 is formed on the common wiring 111, whereby the upper electrode layer 107 to be formed later can be electrically connected to the common wiring 111 even when an EL layer is formed over the common wiring 111.

Alternatively, the EL layer 105 and the upper electrode layer 107 may be formed without a metal mask. Even when the EL layer 105 and the upper electrode layer 107 are formed over the entire region of the light-emitting device 10 without a metal mask, the common wiring 111 can be electrically connected to the upper electrode layer 107. In addition, when the EL layer 105 and the upper electrode layer 107 are formed without a metal mask, a problem caused due to contact between the metal mask and the substrate 101 does not occur, which is preferable.

Figure 12:
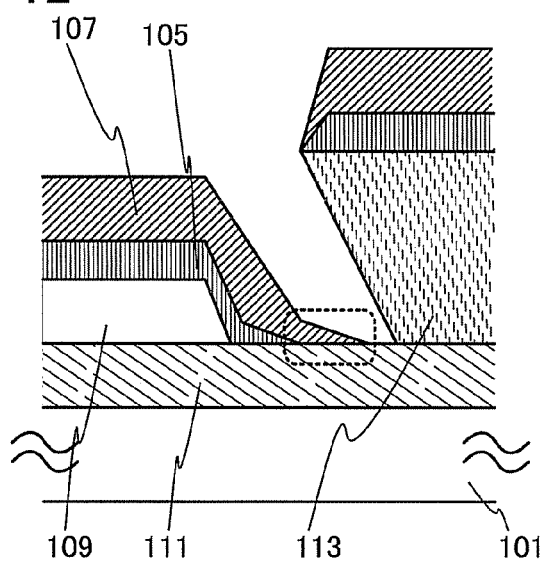
FIG. 12 illustrates a light-emitting device according to an embodiment of the present invention.

FIG. 12 is an enlarged schematic cross-sectional view of a region in which the common wiring 111 and the upper electrode layer 107 are connected to each other.

A region surrounded by a dashed line in FIG. 12 is a contact portion between the common wiring 111 and the upper electrode layer 107. The upper electrode layer 107 is in contact with part of a surface of the common wiring 111 in a region overlapped with the protruding portion of the separation layer 113; thus, the upper electrode layer 107 and the common wiring 111 are electrically connected to each other. Here, the portion of the upper electrode layer 107 which is in contact with the common wiring 111 is thinner than a portion of the upper electrode layer 107 in a light-emitting region (a region in which the lower electrode layer 103, the EL layer 105, and the upper electrode layer 107 are stacked). The contact portion of the upper electrode layer 107 may have a so-called forward tapered shape in which the contact portion becomes thinner as it is closer to the separation layer 113. The contact portion is formed thus thin, whereby a contact area can be increased even when a gap between the side surface of the separation layer 113 and the common wiring 111 is small; thus, contact resistance can be reduced.

In order that the EL layer 105 is divided, the separation layer 113 may have a shape which can prevent the EL layer 105 from being formed on the side surface of the separation layer 113. For example, the separation layer 113 may be formed so that an angle between the surface of the substrate and a line connecting the most protruding point of the separation layer 113 and a point of a side surface of the separation layer 113 which is in contact with the common wiring 111 is as small as possible. Alternatively, the separation layer 113 may have an inwardly curved shape; that is, a space may be provided between the line and the side surface of the separation layer 113.

Although the separation layer 113 is provided on and in contact with the common wiring 111 in this embodiment, the separation layer 113 is not necessarily provided on and in contact with the common wiring 111 as long as at least part of a region overlapped with the protruding portion of the separation layer 113 overlaps with the surface of the common wiring 111.

Further, the common wiring 111 is led to the outside of the light-emitting device 10; accordingly, a potential to be applied to the upper electrode layer 107 can be supplied to the common wiring 111. Further, the lower electrode layer 103 is also led to the outside of the light-emitting device 10; accordingly, a potential applied to the lower electrode layer 103 can be supplied to the lower electrode layer 103. Note that in this embodiment, a structure in which the common wiring 111 is formed using a material and a process different from those of the lower electrode layer 103 is described; however, the common wiring 111 may be manufactured using the same material, which has sufficiently lower resistance than the upper electrode layer 107, and the same process as those of the lower electrode layer 103. Further, the lower electrode layer 103 may be connected to a lead wiring which is formed using the same material as the common wiring 111.

The common wiring 111 and the separation layer 113 as described above are applied to the light-emitting device 10, whereby a metal mask covering a connection portion between the common wiring 111 and the upper electrode layer 107 in formation of the EL layer 105 is not needed, and the EL layer 105 can be formed using the metal mask used for forming the upper electrode layer 107. Therefore, the number of metal masks used in manufacture of the light-emitting device 10 can be reduced; thus, a problem caused due to contact between the metal mask and the substrate is reduced and a highly reliable light-emitting device can be provided.

Structural Example 2

The common wiring 111 provided with the separation layer 113 as described above can also be used as an auxiliary wiring for supporting conductivity of the upper electrode layer 107. Hereinafter, a light-emitting device 100 in which the common wiring 111 over which the separation layer 113 is formed is used as an auxiliary wiring of the upper electrode layer 107 is described.

Figure 2A:
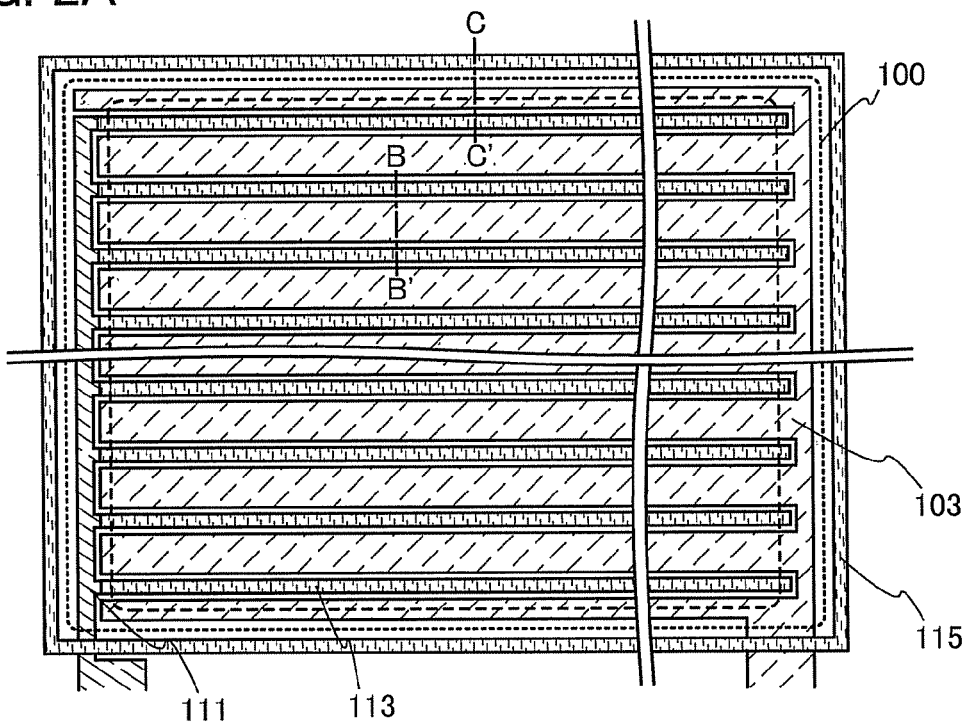
FIGS. 2A to 2C illustrate a light-emitting device according to an embodiment of the present invention.
Figure 2B:
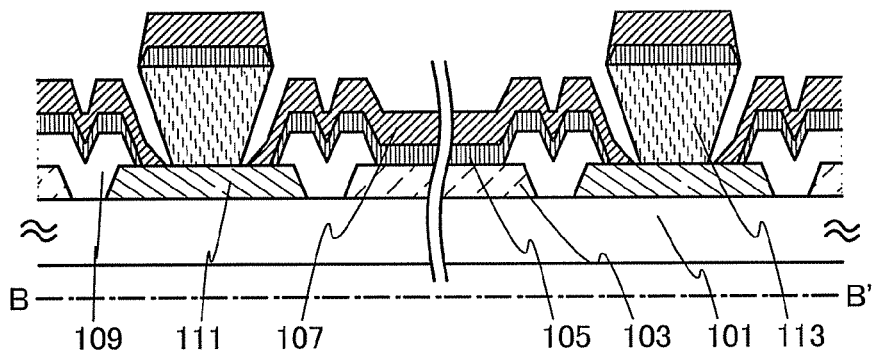
Figure 2C:
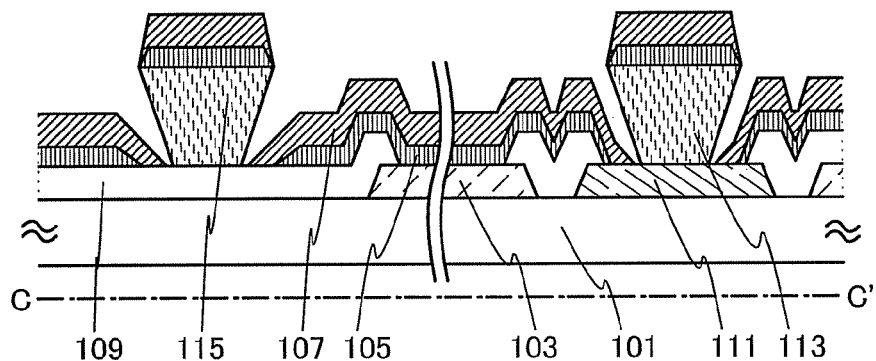

FIG. 2A is a schematic top view of a light-emitting device 100. FIG. 2B is a schematic cross-sectional view taken along line B-B' in FIG. 2A. FIG. 2C is a schematic cross-sectional view taken along line C-C' in FIG. 2A. Note that an EL layer and an upper electrode layer are not illustrated in FIG. 2A for simplicity.

The light-emitting device 100 includes, over the substrate 101, the lower electrode layer 103, the EL layer 105, the upper electrode layer 107, the partition 109, and the common wiring 111. Further, the separation layer 113 formed over the common wiring 111 and a separation layer 115 surrounding the light-emitting device 100 is provided.

Although not illustrated, the light-emitting device 100 may include a base film which is in contact with the substrate 101 and a sealing film which covers the upper electrode layer 107. With the base film and the sealing film, deterioration of the EL layer can be suppressed, and thus, the reliability of the light-emitting device 100 can be increased.

In the light-emitting device 100, voltage is applied to a light-emitting element which includes the lower electrode layer 103, the upper electrode layer 107, and the EL layer 105 sandwiched therebetween, so that light emission can be obtained.

The partition 109 is formed at end portions of the lower electrode layer 103 and the common wiring 111. The partition 109 is provided at the end portions of the lower electrode layer 103 and the common wiring 111 in order to prevent the EL layer 105 and the upper electrode layer 107 from being disconnected at the steps of the lower electrode layer 103 and the common wiring 111. Therefore, the partition 109 preferably has a forward tapered shape so that a film formed thereover is not disconnected. In the forward tapered shape, a layer gradually increases in thickness from its upper edge and is in contact with a layer serving as a base in a cross section.

The common wiring 111 is formed using a conductive material having sufficiently lower resistance than at least a material of the upper electrode layer 107. The separation layer 113 is provided on and in contact with the common wiring 111.

The separation layer 113 has an insulating property and an upper portion thereof protrudes in a direction parallel to a surface of the substrate 101. In other words, when the separation layer 113 is projected on the surface of the substrate, the area which is in contact with the common wiring 111 is smaller than the projected area and is provided inside the projected area.

The separation layer 113 having such a shape is provided and the EL layer 105 and the upper electrode layer 107 are formed by methods described later, so that as illustrated in FIG. 2B, the EL layer 105 is divided by the separation layer 113. Further, the upper electrode layer 107 is in contact with a top surface of the common wiring 111 in a region overlapped with the protruding portion of the separation layer 113 and is electrically connected to the common wiring 111.

Accordingly, the upper electrode layer 107 is not electrically disconnected and electrical connection of the upper electrode layer 107 is secured through the common wiring 111 over the entire light-emitting region of the light-emitting device 100. Further, a potential drop due to the resistance of the upper electrode layer 107 can be suppressed by the common wiring 111 electrically connected to the upper electrode layer 107.

In order that the EL layer 105 is divided, the separation layer 113 may have a shape which can prevent the EL layer 105 from being formed on the side surface of the separation layer 113. For example, the separation layer 113 may be formed so that an angle between the surface of the substrate and a line connecting the most protruding point of the separation layer 113 and a point of a side surface of the separation layer 113 which is in contact with the common wiring 111 is as small as possible. Alternatively, the separation layer 113 may have an inwardly curved shape; that is, a space may be provided between the line and the side surface of the separation layer 113.

Further, the common wiring 111 is led to the outside of the light-emitting device 100, and a potential to be applied to the upper electrode layer 107 can be supplied to the common wiring 111. Further, the lower electrode layer 103 is also led to the outside of the light-emitting device 100, and a potential applied to the lower electrode layer 103 can be supplied to the lower electrode layer 103.

The light-emitting device 100 is provided with the separation layer 115 surrounding the light-emitting device 100 over the partition 109. The separation layer 115 has a function of physically and electrically dividing the EL layer 105 and the upper electrode layer 107. Therefore, when the separation layer 115 surrounds the light-emitting device 100, the upper electrode layer 107 included in the light-emitting device 100 can be electrically isolated from the a portion outside the separation layer 115 even in the case where the EL layer 105 and the upper electrode layer 107 are formed without a metal mask, for example.

FIG. 2C is a schematic cross-sectional view taken along line C-C' in FIG. 2A. The separation layer 115 which is provided so as to surround the light-emitting device 100 is formed over the partition 109 and divides each of the EL layer 105 and the upper electrode layer 107. When the light-emitting devices 100 are provided adjacent to each other, they can be electrically isolated from each other by the separation layer 115.

The separation layer 115 is formed using a material and a step similar to those of the separation layer 113, and an upper portion thereof protrudes in a direction parallel to a surface of the substrate 101. Accordingly, the separation layer 115 divides the EL layer 105 and the upper electrode layer 107 at the time of formation. End portions of both the EL layer 105 and the upper electrode layer 107 divided by the separation layer 115 are in contact with the partition 109. Thus, the upper electrode layer 107 is electrically isolated by the separation layer 115.

The separation layer 115 is not necessarily provided in the case where only one light-emitting device 100 is used or in the case where the adjacent light-emitting devices 100 are not necessarily electrically isolated from each other.

In this structural example, the common wiring 111 and the lower electrode layer 103 are formed side by side over the substrate 101, using different materials and in the separate steps; however, for example, the common wiring 111 and the lower electrode layer 103 can be formed using the same material and in the same step. In that case, a lead wiring of a material having low resistance may be formed over the substrate 101, a planarization film having an opening portion may be provided over the lead wiring, and the lead wiring may be connected to the common wiring 111 or the lower electrode layer 103. In the case of a top-emission light-emitting device, when a lead wiring is provided below the light-emitting device 100, a light-emitting area over the substrate 101 can be increased.

The common wiring 111 and the separation layer 113 as described above are applied to the light-emitting device 100, whereby a metal mask covering a connection portion between the common wiring 111 and the upper electrode layer 107 in formation of the EL layer 105 is not needed, and the EL layer 105 can be formed using the metal mask used for forming the upper electrode layer 107. Therefore, the number of metal masks used in manufacture of the light-emitting device 100 can be reduced; thus, a problem caused due to contact between the metal mask and the substrate is reduced and a highly reliable light-emitting device can be provided.

With the common wiring 111 formed using a material having low resistance, an adverse effect of a potential drop due to the resistance of the upper electrode layer 107 can be extremely suppressed and a highly reliable light-emitting device can be provided. In particular, a great effect can be expected in the case of a top-emission light-emitting device including a transparent conductive film having high resistance as the upper electrode layer 107.

Further, even in the case where a plurality of the light-emitting devices 100 is provided adjacent to each other, the separation layer 115 is provided to surround each of the light-emitting devices 100 as described above, whereby the light-emitting devices 100 can be electrically isolated from each other when the EL layer 105 and the upper electrode layer 107 are formed without a metal mask. In addition, since the EL layer and the upper electrode layer can be formed without a metal mask, a problem caused due to contact between the metal mask and the substrate does not occur and a highly reliable EL light-emitting device can be provided.

<Material>

Examples of materials used for the respective layers are described below.

[Substrate]

In the case where the light-emitting device 100 is a bottom emission type or a dual emission type, a light-transmitting material such as glass, quartz, or an organic resin can be used as a material of the substrate 101. In the case of a top emission type, a light-transmitting property is not always necessary, and a material such as a metal, a semiconductor, ceramics, and a colored organic resin can be used other than the above materials. In the case where a conductive substrate is used, a surface of the substrate preferably has an insulating property by oxidation of the surface or formation of an insulating film over the surface.

In the case where an organic resin is used for the substrate 101, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

In particular, in the case of the top-emission light-emitting device 100, a substrate having high thermal conductivity, such as a metal substrate, is preferably used. In the case of a large lighting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

[Sealing Film and Base Film]

In the case of a bottom-emission or dual-emission light-emitting device, a sealing film and a base film can be formed using a material having a light-transmitting property and a barrier property. In the case of a top-emission light-emitting device, a light-transmitting property is not always necessary.

As each of the sealing film and the base film, an inorganic insulating film can be formed by a sputtering method, for example. For example, a silicon nitride film, an aluminum oxide film, a silicon oxide film, or the like may be formed. The sealing film or the base film which is provided on the side opposite to the direction in which light is extracted may be a stack of a metal film and the above inorganic insulating film.

The sealing film is preferably a gas barrier film in which permeability of moisture is lower than or equal to $10^{-6}$ g/m$^2$·day, for example. A stacked layer structure in which at least one layer containing an inorganic material is provided between layers containing an organic material can be used for the sealing film, for example. As the layer containing an organic material, an adhesive layer such as an epoxy-based adhesive layer can be given as an example. As the layer containing an inorganic material, a film with a barrier property, such as a silicon oxide film or a silicon nitride film can be given as an example.

When an organic resin is used for a substrate, a glass layer with a thickness greater than or equal to 25 µm and less than or equal to 100 µm may be used as a base layer. The thickness of the glass layer is typically greater than or equal to 45 µm and less than or equal to 80 µm. By combining an organic resin substrate and a glass layer, moisture, an impurity, or the like can be prevented from entering an organic compound or a metal material included in the light-emitting element from the outside of the light-emitting device, and the weight of the light-emitting device can be reduced.

[Separation Layer]

A separation layer can be formed using an inorganic insulating material or an organic insulating material. For example, a negative or positive photosensitive resin material, a non-photosensitive resin material, or the like can be used.

[Light-Emitting Element]

As a light-transmitting material which can be used for an electrode layer through which light is extracted, indium oxide, indium tin oxide, indium zinc oxide, zinc oxide, zinc oxide to which gallium is added, graphene, or the like can be used.

Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used. Further alternatively, a nitride of the metal material (e.g., titanium nitride) or the like may be used. In the case of using the metal material (or the nitride thereof), the electrode layer may be thinned so as to be able to transmit light.

Further, a stacked film of any of the above materials can be used as the electrode layer. For example, when a stacked film of an alloy of silver and magnesium and indium tin oxide is used, conductivity can be increased, which is preferable.

The thickness of the electrode layer through which light is extracted is, for example, greater than or equal to 50 nm and less than or equal to 300 nm, preferably greater than or equal to 80 nm and less than or equal to 130 nm, more preferably greater than or equal to 100 nm and less than or equal to 110 nm.

An EL layer includes at least a layer containing a light-emitting organic compound. In addition, the EL layer can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in an embodiment of the present invention, a light-emitting element in which a plurality of EL layers are provided between an upper electrode layer and a lower electrode layer (a tandem light-emitting element) can be used. A stacked-layer structure of two layers, three layers, or four layers (in particular, a stacked-layer structure of three layers) is preferably used. Examples of structures of the EL layer will be described in detail in Embodiment 4.

An electrode layer which is provided on the side opposite to the side from which light is extracted is formed using a reflective material. As the reflective material, a metal material such as aluminum, gold, platinum, silver, nickel, tungsten, chromium, molybdenum, iron, cobalt, copper, or palladium can be used. In addition, any of the following can be used:

alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

[Common Wiring and Wiring]

A common wiring and a wiring can be formed of a single layer or a stacked layer using a material such as copper (Cu), titanium (Ti), tantalum (Ta), tungsten (W), molybdenum (Mo), chromium (Cr), neodymium (Nd), scandium (Sc), or nickel (Ni), or an alloy material containing any of these materials as its main component. Aluminum can also be used for the material of the wiring; however, in that case, the wiring might be corroded when the wiring is provided to be in direct contact with indium tin oxide or the like. Therefore, it is preferable that the wiring have a stacked-layer structure and that aluminum be used for a layer which is not in contact with indium tin oxide or the like. Copper can be preferably used because of its low resistance. The thickness of the wiring is preferably greater than or equal to 100 nm and less than or equal to 35 μm.

[Partition]

As a material of a partition, for example, an organic resin such as a polyimide resin, an acrylic resin, a polyamide resin, or an epoxy resin or an inorganic insulating material can be used.

The angle of a side surface of a layer whose end portion with a forward tapered shape is in contact with a layer to be a base is greater than or equal to 10° and less than or equal to 85°, preferably greater than or equal to 60° and less than or equal to 80°.

It is particularly preferable that the partition be formed using a photosensitive resin material to have an opening portion so that a side surface of the opening portion is formed as an inclined surface with continuous curvature. Specifically, the radius of curvature of a curve drawn by a cross section of an insulating film is desirably approximately 0.2 μm to 2 μm.

There is no particular limitation, on the method for forming the partition. A sputtering method, an evaporation method, a coating method, a droplet discharging method (e.g., an inkjet method), a printing method (e.g., a screen printing method or an offset printing method), or the like may be used.

The thickness of the partition may be greater than or equal to 20 nm and less than or equal to 20 μm, for example. The thickness of the partition is preferably greater than or equal to 50 nm and less than or equal to 3 μm.

[Planarization Film]

A planarization film can be formed using an inorganic insulating material or an organic insulating material. Note that a heat-resistant organic insulating material such as an acrylic resin, a polyimide resin, a benzocyclobutene-based resin, a polyamide resin, or an epoxy resin is preferably used as a planarization insulating film. Other than the above organic insulating materials, it is possible to use a low-dielectric constant material (a low-k material), a siloxane-based resin, phosphosilicate glass (PSG), borophosphosilicate glass (BPSG), or the like. Note that the planarization film may be formed by stacking a plurality of insulating films formed using these materials.

A method for forming the planarization film is not particularly limited, and a sputtering method, a spin coating method, a dipping method, a printing method, an inkjet method, or the like can be used depending on the material of the planarization film.

<Example of Manufacturing Method>

Next, an example of a method for manufacturing the light-emitting device 100 over a substrate will be described with reference to FIGS. 3A to 3D.

Note that a top-emission light-emitting device is described as an example of the light-emitting device 100 in this embodiment; however, in the case of a bottom-emission light-emitting device, a light-transmitting material may be used for a lower electrode layer and a reflective material may be used for an upper electrode layer. In the case of a dual-emission light-emitting device, a light-transmitting material may be used for each of the upper electrode layer and the lower electrode layer.

In the case of forming the light-emitting device 10, in the manufacturing method of the light-emitting device 100 described below, each layer is patterned in a different manner, so that the light-emitting device 10 can be manufactured in the following manufacturing method.

First, the lower electrode layer 103 and the common wiring 111 are formed over the substrate 101.

The lower electrode layer 103 and the common wiring 111 are formed in the following manner: first, conductive films for forming the lower electrode layer 103 and the common wiring 111 are formed by a deposition method such as a sputtering method, and then, unnecessary portions are removed by a known photolithography method.

Here, either the lower electrode layer 103 or the common wiring 111 may be formed first. In this case, it is important that in etching of a conductive film formed later, an etching method by which the layer formed first is not etched is selected. In the case where the lower electrode layer 103 and the common wiring 111 are formed using the same material, they can be simultaneously formed.

Note that a base film may be formed before the lower electrode layer 103 is formed. An insulating film serving as a barrier film can be used as the base film, and can be formed by a film formation method such as a CVD method or a sputtering method.

Further, a lead wiring may be formed over the substrate 101 using a material having low resistance, a planarization film having an opening portion may be formed over the lead wiring, and the common wiring 111 and the lower electrode layer 103 formed over the planarization film may be connected to the lead wiring. Any of the insulating materials described above may be used for the planarization film.

Next, the partition 109 is formed. The partition 109 can be formed using the material and the manufacturing method described above. For example, the partition 109 is formed in such a manner that a photosensitive resin material is applied by a spin coating method, and then, light exposure and development treatment are performed.

Figure 3A:
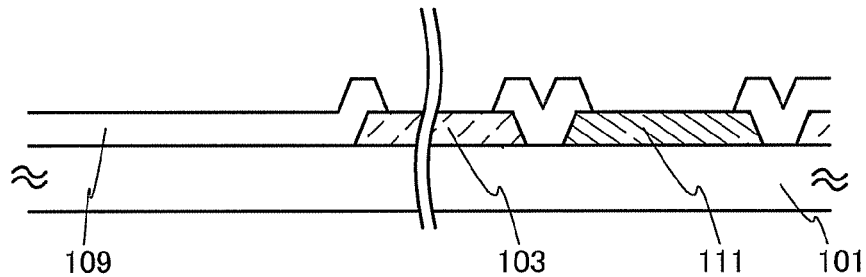
FIGS. 3A to 3D illustrate a method for manufacturing a light-emitting device according to an embodiment of the present invention.

FIG. 3A illustrates a schematic cross-sectional view at this stage.

Next, the separation layers 113 and 115 are formed. Here, a method for forming the separation layers 113 and 115 using a negative photosensitive organic resin is described.

First, an organic resin film 117 is formed using a negative photosensitive organic resin. The organic resin film 117 can be formed by an application method such as a spin coating method, a droplet discharging method such as an inkjet method, or a printing method such as a screen printing method or an offset printing method.

Figure 3B:
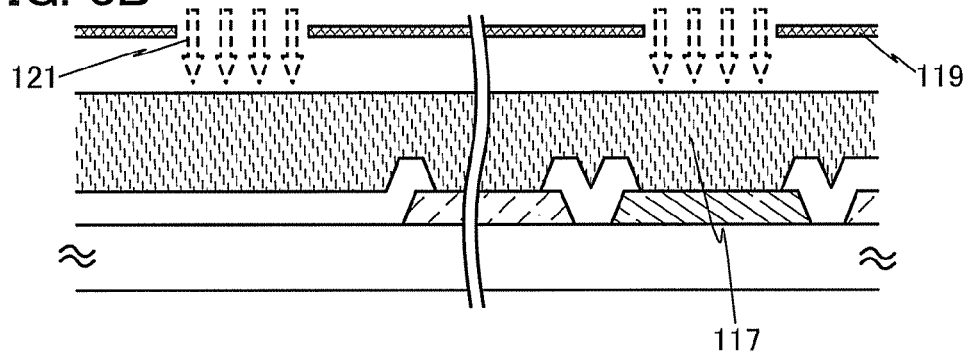

Then, regions of the organic resin film 117, in which the separation layers 113 and 115 are formed later, are irradiated with exposure light 121 through a mask 119 (FIG. 3B). Here, the exposure light 121 is adjusted so that the intensity of the exposure light becomes lower in a region closer to the substrate 101 in the thickness direction of the organic resin film 117. A negative photosensitive organic resin has a property in which solubility of an exposed region in later development treatment is decreased. Therefore, light irradiation is performed so that the intensity of the exposure light on a film surface is highest and the intensity becomes lower in a region closer to the substrate 101, whereby the separation layers 113 and 115 which are formed through development treatment each have a shape in which the projected area is reduced in a region closer to the substrate 101.

In the light exposure, focus of the exposure light may be intentionally changed so that the intensity of the exposure light in a region close to the substrate 101 becomes low.

Figure 3C:
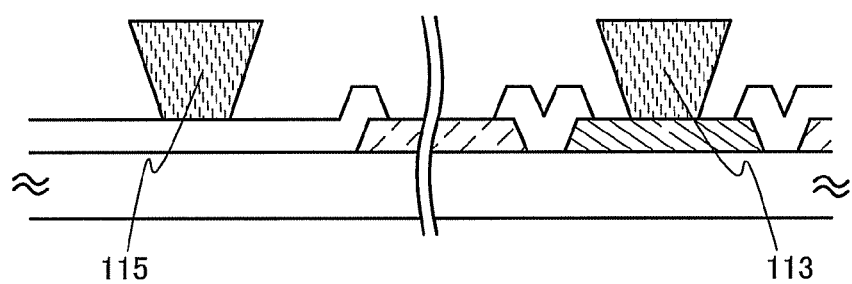

Then, development treatment is performed. Regions of the organic resin film 117, which are not irradiated with the exposure light 121, are removed, so that the separation layers 113 and 115 are formed (FIG. 3C). The separation layers 113 and 115 may be cured by heat treatment.

In the case where an inorganic insulating material is used for each of the separation layers 113 and 115, each of the separation layers 113 and 115 may be formed in such a manner that an inorganic insulating film is formed by a deposition method such as a sputtering method or a CVD method, and then an unnecessary portion of the inorganic insulating film is etched by a known photolithography method using a resist mask. In this etching, etching time is extended so that a lower portion of a side surface is further etched after the inorganic insulating film is etched, whereby the separation layers 113 and 115 having inversely tapered shapes can be obtained.

It is important that the separation layers 113 and 115 each have a shape which allows the upper electrode layer 107 to be physically divided in its formation. For example, when the separation layers 113 and 115 have a shape in which an upper portion largely protrudes or a shape in which a side surface curves inward largely, the upper electrode layer 107 is not formed on the side surfaces of the separation layers 113 and 115, which can prevent a problem in that the upper electrode layer 107 is not physically divided.

The separation layer 115 may be a single layer as described above or a multilayer including two or more layers. In the case of a multilayer, an insulating organic material and an insulating inorganic material may be used in combination.

Figure 3D:
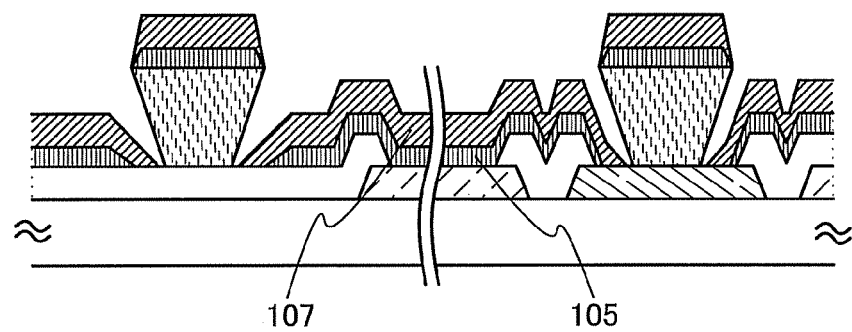

Next, the EL layer 105 and the upper electrode layer 107 are formed without a metal mask (FIG. 3D).

The EL layer 105 can be formed by an evaporation method. Here, the EL layer 105 formed is physically divided by the separation layer 113 and the separation layer 115. In the vicinity of the separation layer 113, an end portion of the EL layer 105 crosses over the partition 109 to be formed on and in contact with the common wiring 111. In the vicinity of the separation layer 115, an end portion of the EL layer 105 is formed on and in contact with the partition 109.

The upper electrode layer 107 can be formed by an evaporation method or a sputtering method. In formation of the upper electrode layer 107, it is important that the upper electrode layer 107 is formed in contact with at least the region of the surface of the common wiring 111, which is overlapped with the protruding portion of the separation layer 113. In order that the upper electrode layer 107 is formed in contact with at least the region of the surface of the common wiring 111, which is overlapped with the protruding portion of the separation layer 113, the upper electrode layer 107 is formed in such a manner that the distance between an evaporation source or a sputtering target and the substrate 101 is shortened, for example.

The upper electrode layer 107 formed in this manner crosses over the end portion of the EL layer 105 to be in contact with the common wiring 111, so that the upper electrode layer 107 is electrically connected to the common wiring 111. Accordingly, a potential drop due to the resistance of the upper electrode layer 107 in light emission of the light-emitting device 100 can be suppressed.

After that, a sealing film covering the upper electrode layer 107 is formed. With the sealing film, entry of an impurity such as water from the outside can be suppressed, so that the highly reliable light-emitting device 100 can be provided.

Through the above steps, the light-emitting device 100 can be manufactured. By the above manufacturing method, the light-emitting device 100 can be formed without a metal mask, so that a problem caused due to contact between a metal mask and a substrate does not occur and a highly reliable light-emitting device can be provided.

Modification Example

The separation layers 113 and 115 described above can have various shapes as long as the separation layers 113 and 115 physically divide the EL layer 105 and the upper electrode layer 107. Hereinafter, examples of shapes that the separation layers 113 and 115 can have are described with reference to FIGS. 4A to 4C.

Figure 4A:
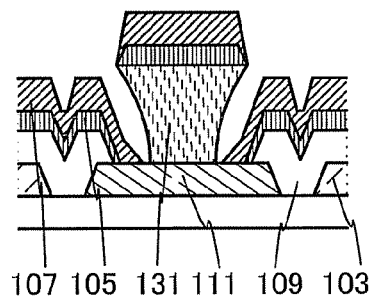
FIGS. 4A to 4C each illustrate a light-emitting device according to an embodiment of the present invention.

A separation layer 131 illustrated in FIG. 4A has a side surface that curves inward. In other words, there is a space between the side surface of the separation layer 131 and a line connecting the outermost point in a bottom portion of the separation layer 131 and the most protruding point in the side surface of the separation layer 131. In the case where the EL layer 105 and the upper electrode layer 107 are formed on the side surface of the separation layer 131, the EL layer 105 and the upper electrode layer 107 can be effectively divided by the separation layer 131 having such an inwardly curved shape.

Figure 4B:
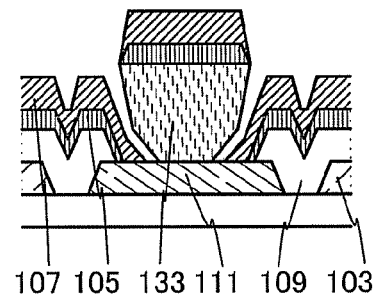

In a separation layer 133 illustrated in FIG. 4B, an angle between a side surface of the separation layer 133 in a lower portion and a contact surface is small. With such a shape, the EL layer 105 and the upper electrode layer 107 in the lower portion can be prevented from curling and being formed on the side surface of the separation layer 133 and the EL layer 105 and the upper electrode layer 107 can be effectively divided.

The separation layer can be formed using two or more insulating materials in combination.

Figure 4C:
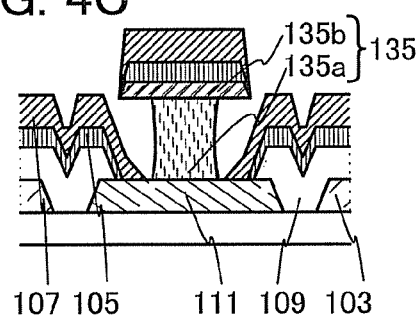

A separation layer 135 illustrated in FIG. 4C includes a leg portion 135a formed using an organic insulating material and a stage portion 135b formed using an inorganic insulating material. The leg portion 135a is formed so that a projected area thereof is smaller than a projected area of the stage portion 135b and is provided inside the projected area of the stage portion 135b. The leg portion 135a may have an inwardly curved shape as illustrated in FIG. 4C. When a surface in the bottom portion of the stage portion 135b, which faces the substrate 101, is exposed, the EL layer 105 and the upper electrode layer 107 can be effectively divided even in the case where the EL layer 105 and the upper electrode layer 107 are formed on a side surface of the separation layer 135. For example, the separation layer 135 may be formed in the following manner: a stacked film of an organic insulating film and an inorganic insulating film is formed; the inorganic insulating film is etched by a photolithography method first to form the stage portion 135b; after that, the organic insulating film is etched with the use of the stage portion 135*b* as a hard mask; and additional etching is performed to form the leg portion 135*a* so that the side surface of the organic insulating film is reduced.

Note that the shape of the separation layer which can be applied to the light-emitting device 100 is not limited to the above examples, and may be any shape as long as the separation layer can physically divide an EL layer and an upper electrode layer in film formation. The separation layer has an insulating property and an upper portion thereof protrudes in a parallel direction to a surface of a substrate. In other words, when the separation layer is projected on the surface of the substrate, the area which is in contact with a lower layer is smaller than the largest projected area and is provided inside the largest projected area. Further, it is preferable that the separation layer has an inwardly curved shape; i.e., there is a space between the side surface of the separation layer a line connecting the outermost point in a bottom portion of the separation layer and the most protruding point in the side surface of the separation layer, because the EL layer and the upper electrode layer can be prevented from being formed on the side surface of the separation layer.

The separation layer may have a stacked-layer structure including two or more layers. A material of the separation layer is an insulating material, and an inorganic insulating film, a non-photosensitive organic insulating film, a (negative or positive) photosensitive organic insulating film, or the like can be used. In the case of a stacked-layer structure, materials can be selected from those described above as appropriate.

The light-emitting device 100 may have a structure in which an auxiliary wiring is also provided for the lower electrode layer 103. In particular, in the case of a bottom-emission (including dual-emission) light-emitting device, a light-transmitting conductive material having relatively high resistance is used for the lower electrode layer 103; therefore, it is effective to provide the auxiliary wiring for the lower electrode layer 103. Also in the case of a top-emission light-emitting device, the resistance of the lower electrode layer 103 cannot be ignored in some cases when the light-emitting area is increased; accordingly, the auxiliary wiring is needed in such a case. Hereinafter, examples of auxiliary wirings provided for the lower electrode layer 103 are described with reference to FIGS. 5A to 5C.

Figure 5A:
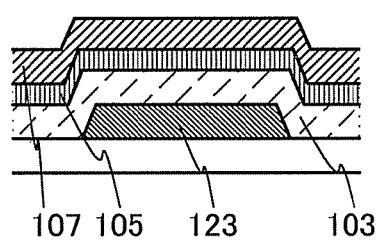
FIGS. 5A to 5C each illustrate a light-emitting device according to an embodiment of the present invention.

In FIG. 5A, an auxiliary wiring 123 is provided in contact with a lower side of the lower electrode layer 103. In such a structure, a region blocking light is only the auxiliary wiring 123 in a bottom emission type; thus, the aperture ratio can be increased. In the case of a top emission type, an area directly above the auxiliary wiring 123 can be a light-emitting region; thus, the aperture ratio is not decreased, which is preferable.

Figure 5B:
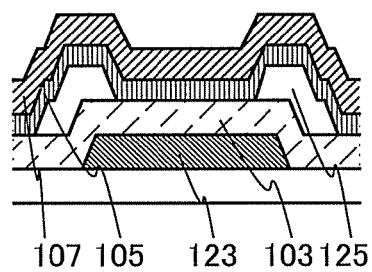
Figure 5C:
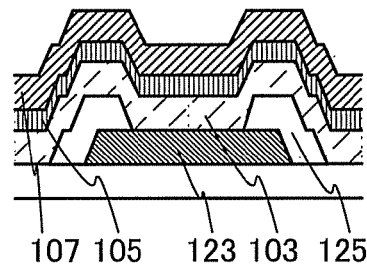

In the case where the EL layer 105 and the upper electrode layer 107 might be disconnected at an end portion of the auxiliary wiring 123, a partition 125 covering the end portion of the auxiliary wiring 123 may be provided. FIG. 5B illustrates a structure in which the partition 125 covering the end portion of the auxiliary wiring 123 is provided in contact with the lower electrode layer 103. A stack of the EL layer 105 and the upper electrode layer 107 is formed in contact with the partition 125 over the end portion of the auxiliary wiring 123, so that disconnection thereof can be prevented. Alternatively, as illustrated in FIG. 5C, the partition 125 may be provided between the auxiliary wiring 123 and the lower electrode layer 103. In particular, when such a structure is used in a top emission type, a region directly above the partition 125 can be a light-emitting region, which is preferable.

Note that only the structures in each of which the auxiliary wiring 123 is provided below the lower electrode layer 103 are described in this embodiment; however, the auxiliary wiring 123 may be provided above the lower electrode layer 103. In that case, the partition 125 may be provided as appropriate in order to reduce an adverse effect of the end portion of the auxiliary wiring 123.

In the case where the lower electrode layer 103 and the common wiring 111 connected to the upper electrode layer 107 are formed using different materials and steps, it is preferable that the auxiliary wiring 123 provided for the lower electrode layer 103 be formed at the same time as formation of the common wiring 111. Formation order of the lower electrode layer 103, the common wiring 111, and the auxiliary wiring 123 is changed as appropriate, so that the common wiring 111 and the auxiliary wiring 123 can be provided over or below the lower electrode layer 103.

Here, the separation layer and the common wiring are used in the light-emitting devices according to an embodiment of the present invention, so that light-emitting devices can be connected in series. For example, in a lighting device including light-emitting devices, converter is used for converting power supply voltage for home use into voltage for driving the lighting device; in the case where the driving voltage of the light-emitting devices is low, conversion efficiency of the converter is low. Therefore, the light-emitting devices are connected in series, whereby driving voltage of the lighting device can be increased and power loss in conversion by the converter can be reduced.

A structure in which light-emitting devices are connected in series with the use of the separation layer and the common wiring described above as examples will be described below with reference to FIGS. 14A and 14B.

Figure 14A:
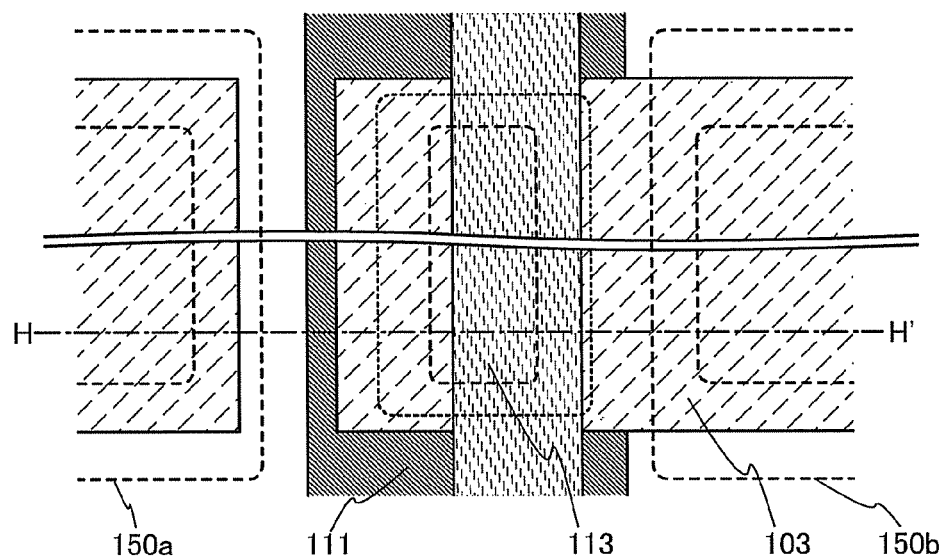
FIGS. 14A and 14B illustrate a light-emitting device according to an embodiment of the present invention.
Figure 14B:
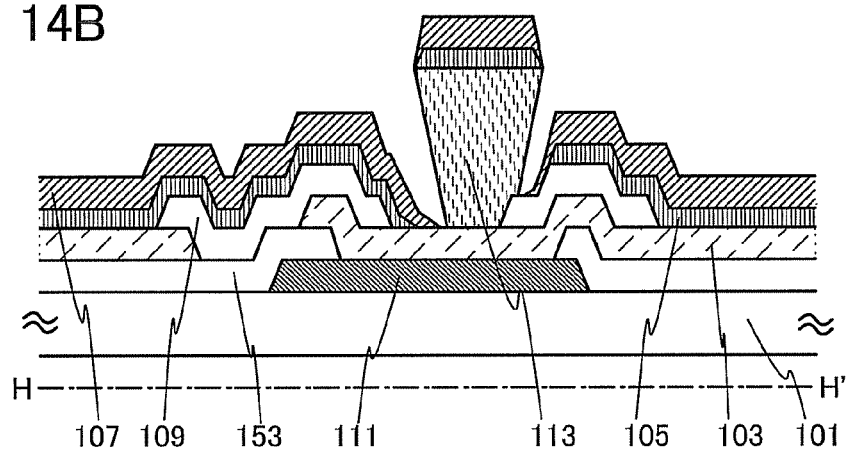

FIG. 14A is a schematic top view of two light-emitting devices each according to an embodiment of the present invention and a series connection portion therebetween. FIG. 14B is a schematic cross-sectional view taken along line H-H' in FIG. 14A. Note that the EL layer 105 and the upper electrode layer 107 are not illustrated in FIG. 14A for simplicity.

In a connection portion between a light-emitting device 150*a* and a light-emitting device 150*b*, an insulating layer 153 having an opening over the common wiring 111, the lower electrode layer 103 of the light-emitting device 150*b*, which is connected to the common wiring 111 through the opening portion, and the partition 109 which overlaps with an end portion of the common wiring 111 with the lower electrode layer 103 interposed therebetween are provided. Further, the light-emitting device 150*a* and the light-emitting device 150*b* are connected in series through the separation layer 113 over the common wiring 111.

Here, a side surface of the separation layer 113 on the light-emitting device 150*b* side is in contact with the partition 109 over the lower electrode layer 103, and an opposite surface of the separation layer 113 is exposed. With such a structure, in a region overlapped with the protruding portion of the separation layer 113, the upper electrode layer 107 of the light-emitting device 150*a* is electrically connected to the lower electrode layer 103 of the light-emitting device 150*b*. Further, the upper electrode layer 107 of the light-emitting device 150*a* and the upper electrode layer 107 of the light-emitting device 150*b* are electrically isolated from each other by the separation layer 113.

Next, an example in which a plurality of light-emitting devices is connected in series by the above connection method is described. Hereinafter, examples in each of which four light-emitting devices are connected in series are described with reference to FIGS. 15A and 15B.

Figure 15A:
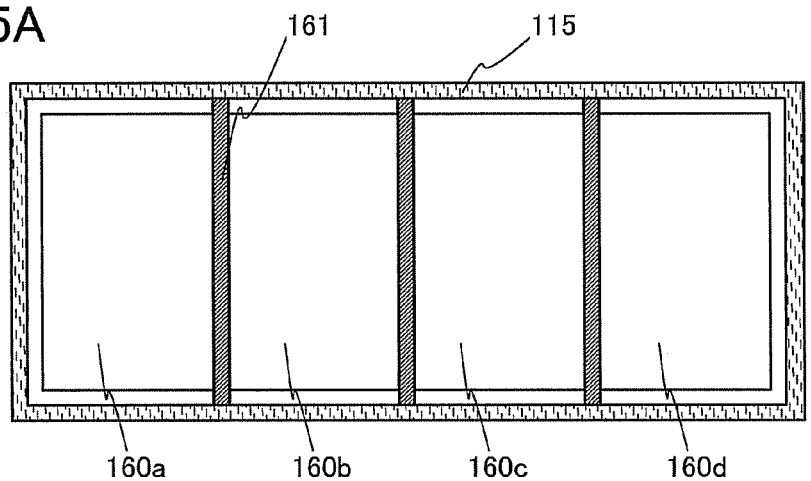
FIGS. 15A and 15B each illustrate a light-emitting device according to an embodiment of the present invention.
Figure 15B:
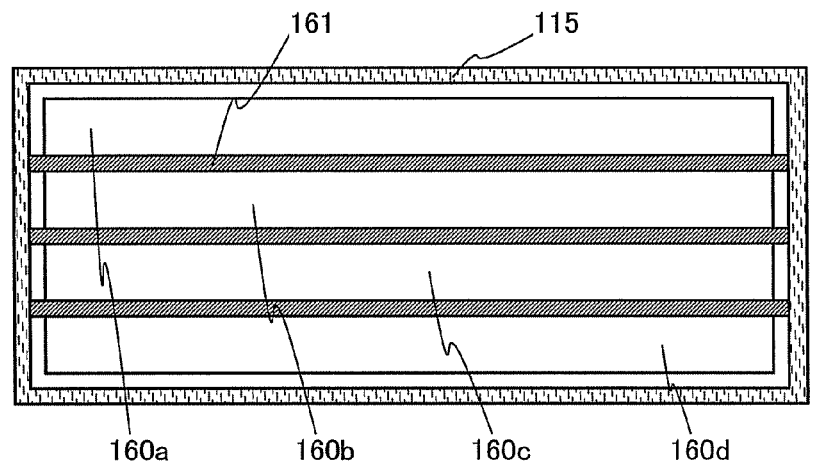

FIGS. 15A and 15B are each a schematic view in which four light-emitting devices (light-emitting devices 160a to 160d) are connected in series.

In FIG. 15A, the four light-emitting devices (light-emitting devices 160a to 160d) are connected in series through connection portions 161. The separation layer 115 surrounds the periphery. The EL layers and the upper electrode layers can be electrically isolated from the outside by the separation layer 115.

FIG. 15B illustrates a structure in which each light-emitting device has a belt-like shape. With the arrangement illustrated in FIG. 15B, a path through which current flows in a light-emitting device can be short, so that luminance unevenness accompanying with voltage drop due to the resistance of a wiring or an electrode can be suppressed.

As the connection portion 161, the connection portion between light-emitting devices, which is described above, can be used.

In the case where a plurality of light-emitting devices is connected in series by the connection portion, the luminance of the light-emitting devices which is farther from the connection portion is decreased more because of a potential drop due to resistance of the upper electrode layer in some cases. Even in such a case, the above-described auxiliary wiring provided with the separation layer is provided for each of the light-emitting devices, whereby the luminances of the lights emitted from the plurality of light-emitting devices can be uniform.

Thus, the common wiring and the separation layer described above are provided between two adjacent light-emitting devices, whereby the light-emitting devices can be connected in series even in the case where an EL layer and an upper electrode layer are formed with a metal mask having an opening portion in a region including at least the separation layer or without a metal mask.

When a plurality of light-emitting devices connected in series is used for a lighting device, power loss in conversion by a converter can be reduced and the lighting device with low power consumption can be provided.

This embodiment can be combined with any of the other embodiments disclosed in this specification as appropriate.
(Embodiment 2)

In this embodiment, an example in which the common wiring and the separation layer which are described in the above embodiment are used for a display device having a plurality of pixel portions will be described with reference to FIGS. 6A to 6C and FIGS. 7A and 7B.

Figure 6A:
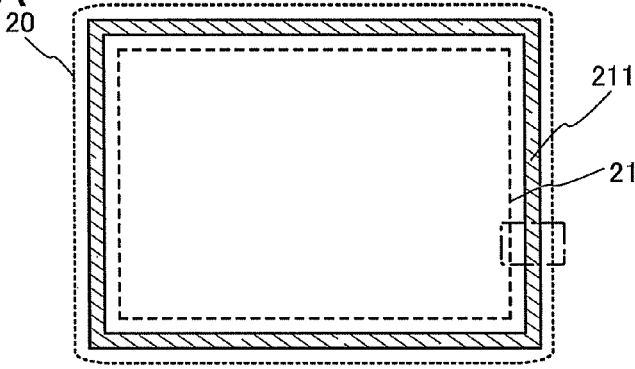
FIGS. 6A to 6C illustrate a display device according to an embodiment of the present invention.

FIG. 6A is a schematic top view of a display device 20 which is an embodiment of the present invention.

The display device 20 includes a display region 21 including a plurality of pixel portions 201 arranged cyclically, and a common wiring 211 surrounding the display region 21. The common wiring 211 is electrically connected to upper electrode layers provided for the pixel portions 201 in the display region 21 and inputs a common potential to the upper electrode layers.

Figure 6B:
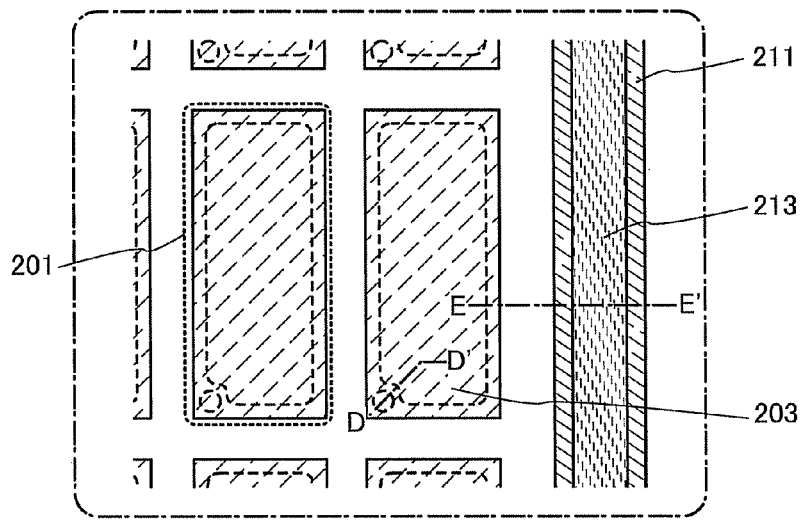

FIG. 6B is an enlarged schematic top view of a region including the pixel portions 201 and the common wiring 211, which is surrounded by a dashed line in FIG. 6A.

The common wiring 211 is provided adjacent to the display region 21 including the plurality of pixel portions 201. For simplicity, in FIG. 6B, only part of a region including the common wiring 211 of the display device 20 is illustrated. In the pixel portion 201, a lower electrode layer 203, a light-emitting region surrounded by a dotted line over the lower electrode layer 203, and a contact region indicated by a dotted circle are only illustrated.

Figure 6C:
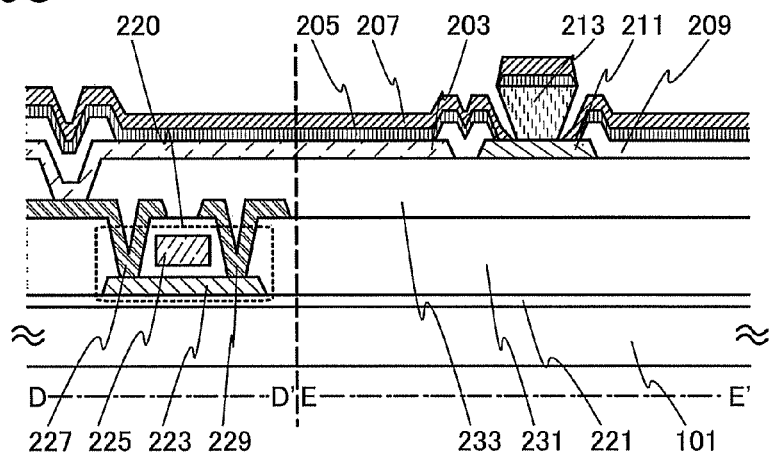

FIG. 6C is a schematic cross-sectional view taken along line D-D' and line E-E' in FIG. 6B. The cross section taken along line D-D' is a schematic cross-sectional view of a region including the contact region and a transistor 220 provided in the pixel portion 201. The cross section taken along line E-E' is a schematic cross-sectional view of a region including the pixel portion 201 provided on the outermost side and the common wiring 211 adjacent thereto.

The pixel portion 201 includes at least one transistor (transistor 220). The pixel portion 201 also includes the lower electrode layer 203 connected to the transistor 220 through the contact region, an EL layer 205, and an upper electrode layer 207. Further, a partition 209 covering end portions of the lower electrode layer 203 and the common wiring 211 described later and the contact region is provided.

Note that a sealing film covering at least the pixel portion 201 is preferably formed.

The transistor 220 is formed over the substrate 101 with a base film 221 interposed therebetween and includes a semiconductor layer 223 and a gate electrode 225. Further, a first electrode 227 is connected to one of a source and a drain provided in the semiconductor layer 223 through a contact hole formed in a first insulating layer 231 covering the transistor 220, and a second electrode 229 is connected to the other of the source and the drain through another contact hole formed in the first insulating layer 231 covering the transistor 220.

Further, the first electrode 227 is connected to the lower electrode layer 203 through a contact portion provided in a second insulating layer 233 covering the transistor 220, the first electrode 227, the second electrode 229, and the first insulating layer 231. Accordingly, the transistor 220 is connected to the lower electrode layer 203.

Voltage or current supplied to the lower electrode layer 203 is controlled by switching operation of the transistor 220, and thus, light emission from the pixel portion 201 is controlled.

The common wiring 211 is provided to surround the plurality of pixel portions 201 and an end portion thereof is covered with the partition 209. The separation layer 213 is formed over the common wiring 211. Further, part of a region of the common wiring 211, which is not covered with either the partition 209 or the separation layer 213, is in contact with the upper electrode layer 207. Accordingly, the upper electrode layer 207 which is provided for the plurality of pixel portions 201 is electrically connected to the common wiring 211.

Various modes of the separation layers described in the above embodiment can be used for the separation layer 213.

Note that the pixel portion 201 includes at least one transistor, and may include a plurality of transistors and a circuit element such as a capacitor depending on a driving method, a circuit structure, or the like of the display device 20.

The pixel portion 201 may be a top emission type, a bottom emission type, or a dual emission type; however, a top emission type is preferable because the aperture ratio in a light-emitting region can be increased. In the case of a bottom emission type or a dual emission type, a light-transmitting material is used as a material included in the transistor 220 (e.g., the semiconductor layer 223, the gate electrode 225, the first electrode 227, or the second electrode 229), whereby light emission can be efficiently obtained, which is preferable.

It is preferable that the color of light emitted from each of the pixel portions 201 be the same, more preferable a white color, and that the lights be extracted through color filters overlapping with the pixel portions 201. The color filter may be formed over the substrate 101 or over a counter substrate.

When the color of light emitted from each of the pixel portions 201 is the same, the EL layers 205 in the pixel portions 201 do not need to be formed separately and can be formed at one step without a metal mask.

In the case of a top emission type, an optical path length adjustment film may be formed over the lower electrode layer 203 so that light emitted from the EL layer 205 and light reflected by the lower electrode layer 203 interfere with each other and light having a specific wavelength is amplified. As the light path length adjustment film, a light-transmitting film which does not influence injection of carriers to the EL layer 205 is preferably used.

Here, another embodiment of a display device to which the common wiring according to an embodiment of the present invention can be applied will be described with reference to FIG. 13.

Figure 13:
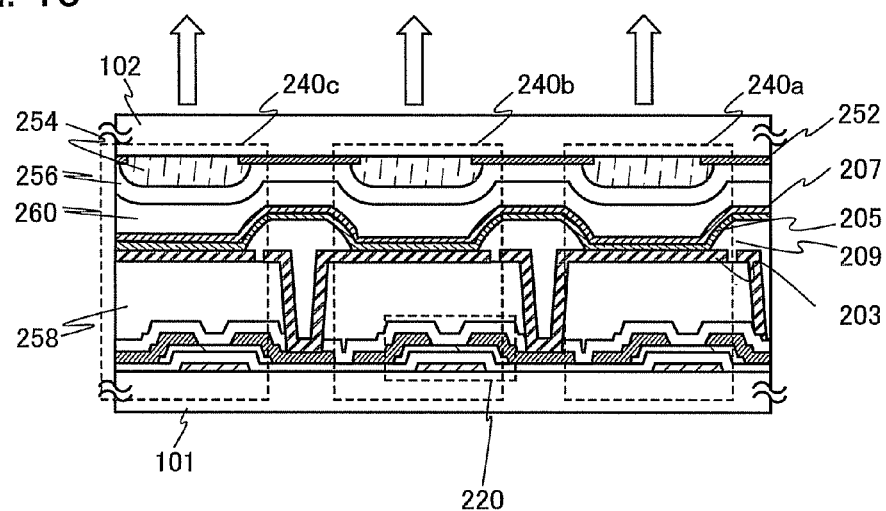
FIG. 13 illustrates a display device according to an embodiment of the present invention.

FIG. 13 is a cross-sectional view of part of pixels of a light-emitting device.

A light-emitting device shown in FIG. 13 emits light in a direction indicated by arrows shown in FIG. 13. In other words, the light-emitting device illustrated in FIG. 13 is a so-called top-emission light-emitting device in which light is emitted not through the substrate 101 provided with the EL layer 205 but through a substrate 102 provided to face the substrate 101.

As illustrated in FIG. 13, a blue pixel 240a, a green pixel 240b, and a red pixel 240c are provided between the substrate 101 and the substrate 102. The transistor 220 which control driving of the light-emitting element and the lower electrode layer 203 which is electrically connected to the transistor 220 through a contact hole provided in an insulating layer 258 are provided over the substrate 101.

Note that there is no particular limitation on a space 260 between the substrate 101 and the substrate 102 as long as the space 260 has a light-transmitting property. It is preferable that the space 260 be filled with a light-transmitting material the refractive index of which is higher than the air. In the case where the refractive index is low, light emitted from the EL layer 205 in an oblique direction is further refracted at an interface of the space 260, and light is emitted from an adjacent pixel in some cases. Thus, for example, the space 260 can be filled with a light-transmitting adhesive having high refractive index and capable of bonding the substrate 101 and the substrate 102. Further, an inert gas or the like such as nitrogen, argon, or the like can be used.

In this embodiment, the blue pixel 240a includes the light-emitting element whose emission intensity exists at least in the wavelength range of blue, the green pixel 240b includes the light-emitting element whose emission intensity exists at least in the wavelength range of green, and the red pixel 240c includes the light-emitting element whose emission intensity exists at least in the wavelength range of red.

In each of the blue pixel 240a, the green pixel 240b, and the red pixel 240c, the EL layer 205 is formed directly on the lower electrode layer 203 and the upper electrode layer 207 is formed over the EL layer 205.

As described above, the light-emitting elements in the pixels (the blue pixel 240a, the green pixel 240b, and the red pixel 240c) have similar structures.

A light-blocking film 252 functioning as a black matrix, color filters 254, and an overcoat 256 are provided for the substrate 102. Each of the color filters 254 is a colored layer, through which light corresponding to the color (blue, green, or red) of light emitted from the light-emitting element passes to be extracted to the substrate 102 side.

The common wiring over which the separation layer is formed can be applied to such a display device. Accordingly, the EL layer 205 and the upper electrode layer 207 can be formed using one metal mask having an opening portion over at least the separation layer.

EL layers of light-emitting elements emit light having the same color and the color filters 254 which enable emission color of each light-emitting element are provided in upper portions; thus, a metal mask used for forming the EL layers separately can be omitted. Accordingly, cost of a metal mask and manufacturing steps can be reduced and probability of occurrence of a problem caused due to contact between a metal mask and a substrate can be low.

As described above, when the common wiring according to an embodiment of the present invention is applied to a display device, a metal mask for covering a connection portion between the common wiring 111 and the upper electrode layer 107 is not needed in formation of the EL layer 105; thus, the metal mask used for forming the upper electrode layer 107 can be used. Accordingly, the number of metal masks used for manufacturing the display device 20 can be reduced. A problem caused due to contact between a metal mask and a substrate can be reduced and a highly reliable display device can be provided.

The common wiring provided with the separation layer, which is an embodiment of the present invention, can be used as an auxiliary wiring for supporting conductivity of an upper electrode layer of a light-emitting element. Hereinafter, a display device 200 in which the common wiring and the separation layer are used as an auxiliary wiring is described.

Figure 7A:
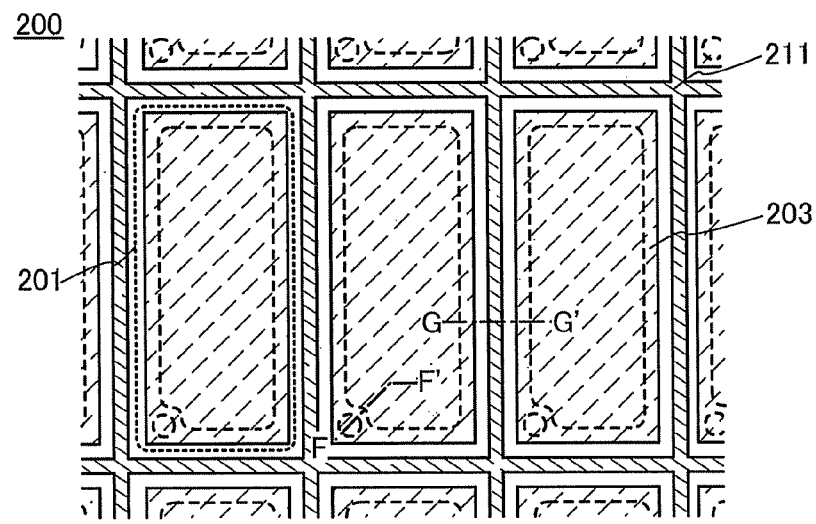
FIGS. 7A and 7B illustrate a display device according to an embodiment of the present invention.

FIG. 7A is a schematic top view of a display device 200 which is an embodiment of the present invention.

The display device 200 includes the plurality of pixel portions 201 arranged cyclically, and the common wiring 211 surrounding the pixel portions 201. For simplicity, in FIG. 7A, only part of a region including the common wiring 211 of the display device 200 is illustrated. In the pixel portion 201, the lower electrode layer 203, a light-emitting region surrounded by a dotted line over the lower electrode layer 203, and a contact region indicated by a dotted circle are only illustrated.

Figure 7B:
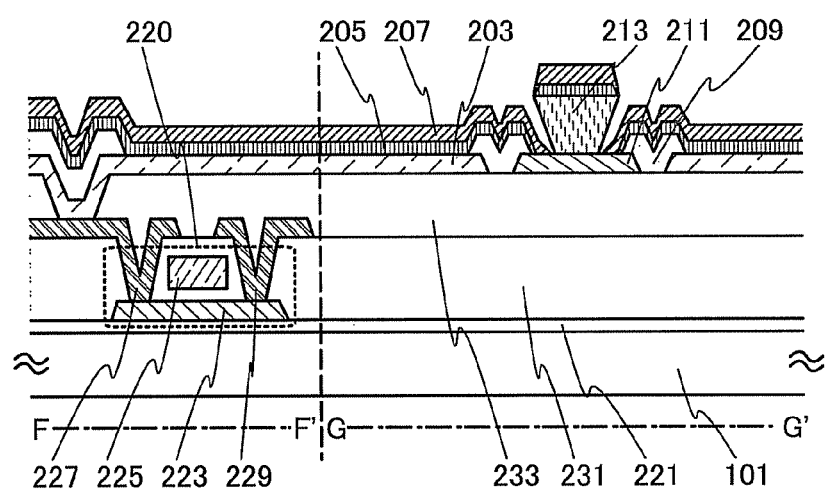

FIG. 7B is a schematic cross-sectional view taken along line F-F' and line G-G' in FIG. 7A. The cross section taken along line F-F' is a schematic cross-sectional view of a region including the contact region and the transistor 220 provided in the pixel portion 201. The cross section taken along line G-G' is a schematic cross-sectional view of a region including the two adjacent pixel portions 201 and the common wiring 211 provided between the pixel portions 201.

The display device 200 has a structure similar to the display device 20 except that the common wiring 211 serving as an auxiliary wiring of an upper electrode layer is provided between the adjacent pixel portions 201.

The common wiring 211 is provided between the lower electrode layers 203 of the two adjacent pixel portions 201, and an end portion of the common wiring 211 is covered with the partition 209. The separation layer 213 is formed over the common wiring 211. Further, part of a region of the common wiring 211, which is not covered with either the partition 209 or the separation layer 213, is in contact with the upper electrode layer 207. Accordingly, the upper electrode layers 207 provided for the plurality of pixel portions 201 are electrically connected to each other through the common wiring 211.

As in the display device 20, the common wiring 211 may be provided to collectively surround a plurality of pixel portions 201 in the display device 200.

An example in which the common wiring 211 surrounds each pixel portion 201 is described in this embodiment; however, the common wiring 211 may be provided to collectively surround two or more pixel portions 201. Alternatively, the common wiring 211 may be provided only in a vertical direction or in a horizontal direction.

As described above, a common wiring of an embodiment of the present invention is used in a display device, whereby a potential drop due to the resistance of an upper electrode layer can be suppressed and a highly reliable display device can be provided. Further, an EL layer and an upper electrode layer can be formed without a metal mask, so that a problem caused due to contact between a metal mask and a substrate does not occur; thus, a highly reliable display device can be provided.

This embodiment can be combined with any of the other embodiments disclosed in this specification as appropriate.

(Embodiment 3)

In this embodiment, an example of a top-emission lighting device in which the light-emitting device described in Embodiment 1 is used will be described with reference to FIGS. 8A and 8B.

Figure 8A:
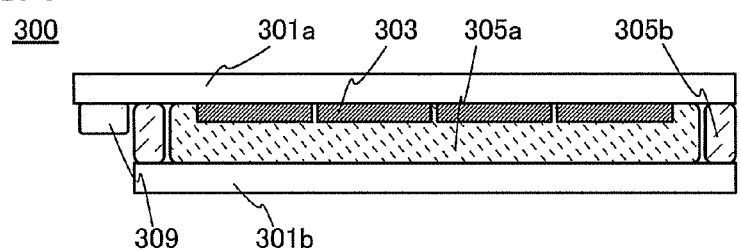
FIGS. 8A and 8B each illustrate a lighting device according to an embodiment of the present invention.

In a lighting device 300 illustrated in FIG. 8A, a plurality of light-emitting devices 303 is formed for a first substrate 301a. The first substrate 301a and a second substrate 301b having a light-transmitting property, which face each other, are attached to each other with a sealant 305a covering the light-emitting devices 303 and a sealant 305b provided at an end portion of the substrates.

Any of the light-emitting devices described in Embodiment 1 can be used as the light-emitting device 303 as appropriate.

It is preferable that a substrate having high thermal conductivity, such as a metal substrate, be used as the first substrate 301a. In the case of a large lighting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

A light-transmitting substrate is used as the second substrate 301b. A surface intersecting with light emitted from the light-emitting device 303, such as a surface of the light-emitting device 303 or top and bottom surfaces of the second substrate 301b, may have an uneven shape in order to prevent total reflection. For example, a hemispherical lens, a microlens array, a film provided with an uneven structure, a light diffusing film, or the like may be attached, or an uneven shape may be directly formed.

As each of the sealants 305a and 305b, a material which can attach facing surfaces to each other can be used. For example, a known sealant formed of a thermosetting material, an ultraviolet curable material, or the like can be used. In particular, a light-transmitting material is preferably used for the sealant 305a. A material used for these is desirably a material which does not transmit moisture or oxygen as much as possible. In addition, a sealant containing a desiccating agent can also be used.

Figure 8B:
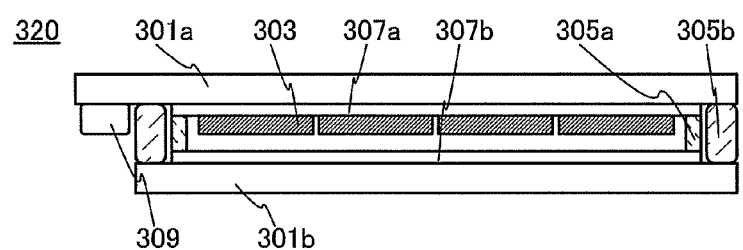

In a lighting device 320 illustrated in FIG. 8B, a structure in which a plurality of the light-emitting devices 303 formed for a first glass layer 307a is sealed with a second glass layer 307b is surrounded by the first substrate 301a and the second substrate 301b.

The first glass layer 307a and the second glass layer 307b are attached to each other with the sealant 305a. The first substrate 301a and the second substrate 301b are attached to each other with the sealant 305b.

Further, a space between the first glass layer 307a and the second glass layer 307b may be filled with a filler such as an inert gas (e.g., nitrogen or argon) or a sealant having a light-transmitting property.

Since the light-emitting devices 303 are sealed between two thin glass layers in the lighting device 320, an impurity such as moisture or oxygen can be prevented from entering from the outside, and thus, a highly reliable light-emitting device can be provided.

Further, each of the lighting devices 300 and 320 is provided with a converter 309, which is connected to the light-emitting devices 303, for the first substrate 301a. The converter 309 converts, for example, power supply voltage for home use into power supply voltage for driving the lighting device. Note that the converter 309 may be formed more on the inside than the sealant 305b.

Further, a material having flexibility, such as plastics, an organic resin film, a thin glass substrate, or a metal thin film, is used as a material of the substrates used for the lighting devices 300 and 320, whereby the lighting device can be light and flexible.

Note that although a top-emission lighting device is described in this embodiment, in the case of a bottom-emission lighting device, for example, a substrate for which a light-emitting device is provided is preferably a light-transmitting substrate.

This embodiment can be combined with any of the other embodiments disclosed in this specification as appropriate.

(Embodiment 4)

In this embodiment, an example of an EL layer which can be applied to an embodiment of the present invention will be described with reference to FIGS. 9A to 9C.

Figure 9A:
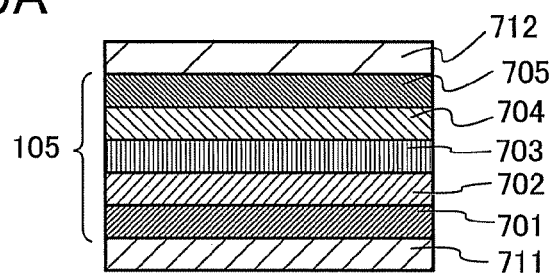
FIGS. 9A to 9C each illustrate an EL element according to an embodiment of the present invention.

As illustrated in FIG. 9A, an EL layer 105 is provided between a first electrode layer 711 and a second electrode layer 712. The first electrode layer 711 and the second electrode layer 712 can have structures similar to those in the above embodiments.

The EL layer 105 includes at least a light-emitting layer containing a light-emitting organic compound. In addition, the EL layer 105 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the first electrode layer 711 side. Note that the stacking order may be inversed.

A manufacturing method of the light-emitting element illustrated in FIG. 9A will be described.

The hole-injection layer 701 is a layer that contains a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used.

A phthalocyanine-based compound such as phthalocyanine (abbreviation: $H_2Pc$) or copper(II) phthalocyanine (abbreviation: CuPc) can be used.

Any of the following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Any of high molecular compounds (e.g., oligomers, dendrimers, or polymers) can be used. As examples of the high molecular compounds, the following are given: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), and the like. A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, a composite material in which an acceptor substance is mixed with an organic compound having a high hole-transport property is preferably used for the hole-injection layer 701. With the use of the composite material in which an acceptor substance is mixed with a substance having a high hole-transport property, excellent hole injection from the first electrode layer 711 can be obtained, which results in a reduction in the driving voltage of the light-emitting element. Such a composite material can be formed by co-evaporation of a substance having a high hole-transport property and an acceptor substance. The hole-injection layer 701 is formed using the composite material, whereby hole injection from the first electrode layer 711 to the EL layer 105 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ $cm^2/Vs$ or higher is preferably used. Note that any other substances may also be used as long as the hole-transport property thereof is higher than the electron-transport property thereof. Specific examples of the organic compounds that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Any of the following aromatic hydrocarbon compounds can also be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Any of the following aromatic hydrocarbon compounds can also be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: $F_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is particularly preferable because it is stable in the air, has a low hygroscopic property, and is easily handled.

Note that the composite material may be formed using any of the above-described electron acceptor and any of the above high molecular compound such as PVK, PV PTPDMA, or Poly-TPD and may be used for the hole-injection layer 701.

The hole-transport layer 702 is a layer that contains a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ $cm^2/Vs$ or higher. Note that any other substances may also be used as long as the hole-transport property thereof is higher than the electron-transport property thereof. Note that the layer containing a substance having a high hole-transport property is not limited to a single layer and may be a stack of two or more layers containing any of the above substances.

A carbazole derivative such as CBP, CzPA, or PCzPA or an anthracene derivative such as t-BuDNA, DNA, or DPAnth may also be used for the hole-transport layer 702.

A high molecular compound such as PVK, PVTPA, PTPDMA, or Poly-TPD can also be used for the hole-transport layer 702.

For the layer 703 containing a light-emitting organic compound, a fluorescent compound which exhibits fluorescence or a phosphorescent compound which exhibits phosphorescence can be used.

As the fluorescent compound that can be used for the layer 703 containing a light-emitting organic compound; a material for blue light emission, a material for green light emission, a material for yellow light emission, and a material for red light emission are given. Examples of the material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Examples of the material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of the material for yellow light emission include rubrene and 5,12-bis(1,1'-biphenyl-4-yl)-6,11-diphenyltetracene (abbreviation: BPT). Examples of the material for red light emission include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-α]fluoranthene-3,10-diamine (abbreviation: p-mPhAFD).

As the phosphorescent compound that can be used for the layer 703 containing a light-emitting organic compound, a material for blue light emission, a material for green light emission, a material for yellow light emission, a material for orange light emission, and a material for red light emission are given. Examples of the material for blue light emission include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyppyridinato-N,$C^{2'}$]iridium(III)picolinate (abbreviation: FIrpic), bis{2-[3',5'-bis(trifluoromethyl)phenyl]pyridinato-N,$C^{2'}$}(abbreviation: Ir(CF$_3$ ppy)$_2$(pic)), and bis[2-(4',6'-difluorophenyl)pyridinato-N,$C^{2'}$]iridium(III) acetylacetonate (abbreviation: FIr(acac)). Examples of the material for green light emission include tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(II)acetylacetonate (abbreviation: Ir(bzq)$_2$(acac)), and tris(benzo[h]quinolinato)iridium(III) (abbreviation: Ir(bzq)$_3$). Examples of the material for yellow light emission include bis(2,4-diphenyl-1,3-oxazolato-N,$C^{2'}$)iridium(II)acetylacetonate (abbreviation: Ir(dpo)$_2$(acac)), bis{2-[4'-(perfluorophenyl)phenyl]pyridinato-N,$C^{2'}$}iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of the material for orange light emission include tris(2-phenylquinolinato-N,$C^{2'}$)iridium(III) (abbreviation: Ir(pq)$_3$), bis(2-phenylquinolinato-N,$C^{2'}$)iridium(III) acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of the material for red light emission include organometallic complexes such as bis[2-(2'-benzo[4,5-α]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(III) (abbreviation: PtOEP). In addition, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the layer 703 containing a light-emitting organic compound may have a structure in which any of the above light-emitting organic compounds (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(H) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

Plural kinds of materials can be used as the host material. For example, in order to suppress crystallization, a substance, such as rubrene, which suppresses crystallization may be further added. In addition, NPB, Alq, or the like may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of a guest material can be suppressed.

A high molecular compound can be used for the layer 703 containing a light-emitting organic compound. Specifically, a material for blue light emission, a material for green light emission, and a material for orange to red light emission are given. Examples of the material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butyl-phenyl)-1,4-diaminobenzene]} (abbreviation: TAB-PFH). Examples of the material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of the material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a layer containing a first light-emitting organic compound and the emission color of a layer containing a second light-emitting organic compound are made complementary, so that the light-emitting element as a whole can emit white light. Note that the word "complementary" means color relationship in which an achromatic color is obtained when colors are mixed. That is, when complementary colored lights emitted from substances are mixed, white-light emission can be obtained. This can be applied to a light-emitting element including three or more layers each containing a light-emitting organic compound.

The electron-transport layer 704 is a layer that contains a substance having a high electron-transport property. Examples of the substance having a high electron-transport property include metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq). Other examples include metal complexes having an oxazole-based or thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$). Besides, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly ones that have an electron mobility of $10^{-6}$ cm$^2$/Vs or higher. Further, the electron-transport layer is not limited to a single layer and may be a stack of two or more layers containing any of the above substances.

The electron-injection layer 705 is a layer that contains a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 9B:
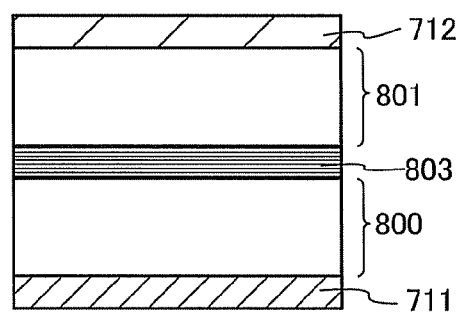

Note that a plurality of EL layers may be stacked between the first electrode layer 711 and the second electrode layer 712 as illustrated in FIG. 9B. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer formed using the composite material and a layer formed using another material. In that case, a layer containing an electron donating substance and a substance having a high electron-transport property, a layer formed of a transparent conductive film, or the like can be used as the layer containing another material. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. This structure can be combined with any of the above structures of the EL layer.

Further, by forming EL layers to emit light of different colors from each other, a light-emitting element as a whole can provide light emission of a desired color. For example, by forming a light-emitting element having two EL layers such that the emission color of a first EL layer and the emission color of a second EL layer are complementary colors, the light-emitting element can provide white light emission as a whole. Note that the word "complementary" means color relationship in which an achromatic color is obtained when colors are mixed. That is, when complementary colored lights emitted from substances are mixed, white-light emission can be obtained. This can be applied to a light-emitting element having three or more EL layers.

Figure 9C:
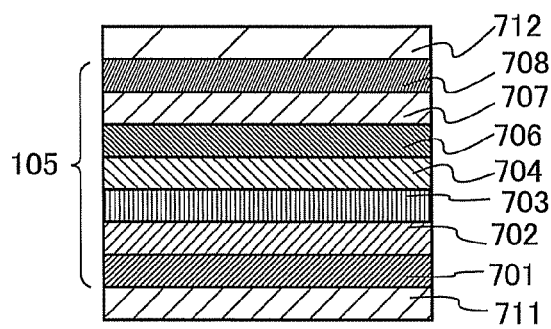

As illustrated in FIG. 9C, the EL layer 105 may include the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode layer 712, between the first electrode layer 711 and the second electrode layer 712.

It is preferable to provide the composite material layer 708 which is in contact with the second electrode layer 712, in which case damage caused to the EL layer 105 particularly when the second electrode layer 712 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, or a compound of the above metal (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)) can be used.

In the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)). Note that as the substance having a high electron-transport property, a material similar to the material for the electron-transport layer 704 described above can be used.

Further, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Thus, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the following is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

A phthalocyanine-based material is preferable as the metal complex having a metal-oxygen bond and an aromatic ligand. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that a phthalocyanine-based material having a phenoxy group is preferable as the phthalocyanine-based materials described above. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as, lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above, a substance having a LUMO level higher than the acceptor level of the acceptor substance contained in the composite material layer 708 can be used as the substance having a high electron-transport property. Specifically, it is preferable to use a substance having a LUMO level of higher than or equal to −5.0 eV, preferably higher than or equal to −5.0 eV and lower than or equal to −3.0 eV. Examples of such a substance include a perylene derivative and a nitrogen-containing condensed aromatic compound. Note that a nitrogen-containing condensed aromatic compound is preferably used for forming the electron-relay layer 707 because of its stability.

Specific examples of the perylene derivative include 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

Specific examples of the nitrogen-containing condensed aromatic compound include pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"terthiophen (abbreviation: DCMT), a methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be faulted using any of the above-described materials.

In the above manner, the EL layer 105 of this embodiment can be manufactured.

This embodiment can be combined with any of the other embodiments disclosed in this specification as appropriate.
(Embodiment 5)

In this embodiment, examples of a lighting device including a light-emitting device according to an embodiment of the present invention will be described with reference to FIGS. 10A and 10B.

According to an embodiment of the present invention, a lighting device in which a light-emitting portion has a curved surface can be realized.

An embodiment of the present invention can be used for lighting in a car; for example, lighting can be provided for a dashboard, ceiling, or the like.

Figure 10A:
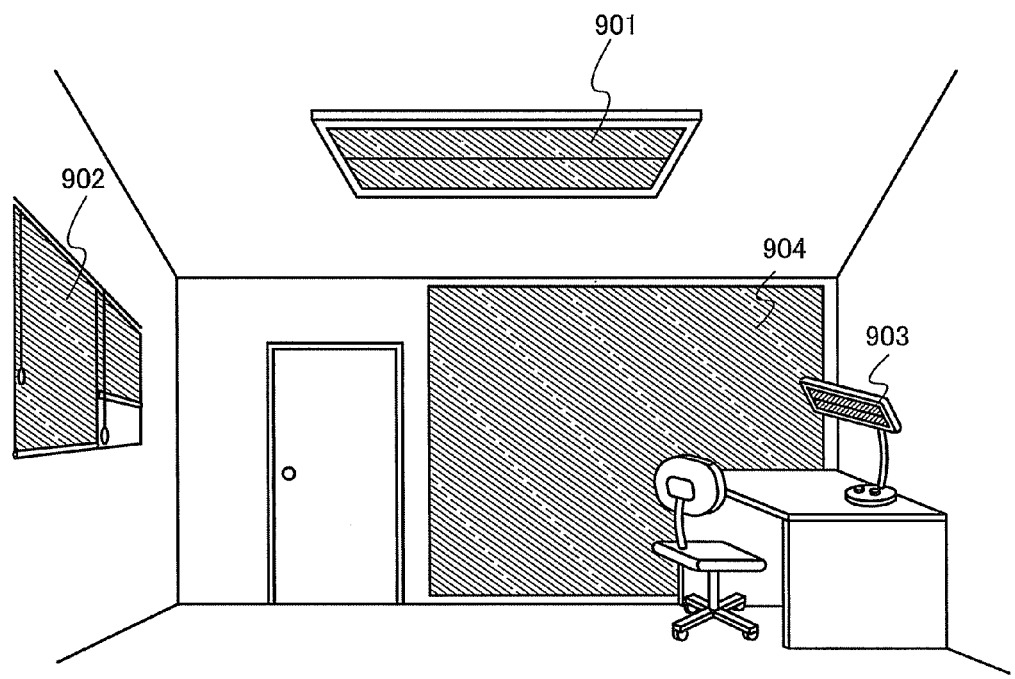
FIGS. 10A and 10B illustrate lighting devices according to embodiments of the present invention.

FIG. 10A illustrates an interior lighting device 901, a desk lamp 903, and a planar lighting device 904 to which an embodiment of the present invention is applied. Since the light-emitting device can have a larger area, it can be used as a lighting device having a large area. Further, since the light-emitting device is thin, the light-emitting device can be mounted on a wall. Furthermore, the light-emitting device can be used as a roll-type lighting device 902.

Figure 10B:
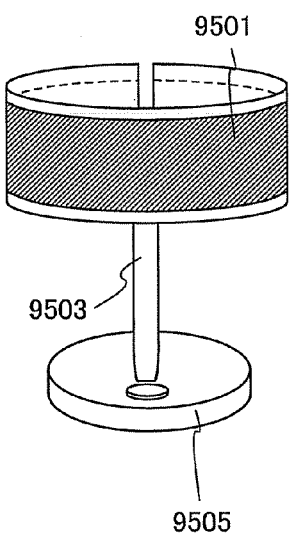

FIG. 10B illustrates another example of the lighting device. A desk lamp illustrated in FIG. 10B includes a lighting portion 9501, a support 9503, a support base 9505, and the like. The lighting portion 9501 includes a light-emitting device according to an embodiment of the present invention. According to an embodiment of the present invention, a lighting device having a curved surface or a lighting device including a flexible lighting portion can be realized in this manner. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be combined with any of the other embodiments disclosed in this specification as appropriate.
(Embodiment 6)

In this embodiment, electronic devices in which the light-emitting devices manufactured in the above embodiments are used will be described with reference to FIGS. 11A to 11C.

As a semiconductor device in which the light-emitting device manufactured in any of the above embodiments is used, a variety of electronic devices (including an amusement machine) can be given. Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

Figure 11A:
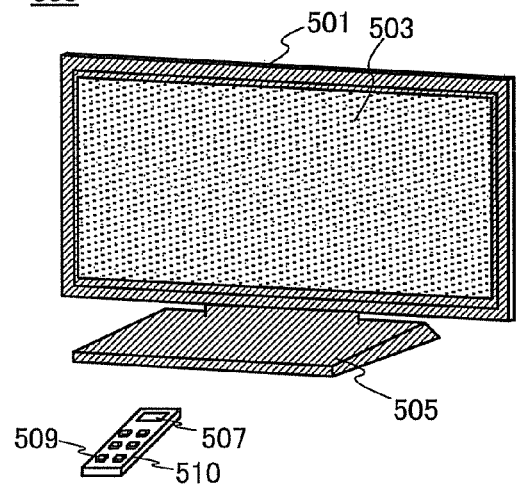
FIGS. 11A to 11C each illustrate an electronic device according to an embodiment of the present invention.

FIG. 11A illustrates an example of a television set. In a television set 500, a display portion 503 is incorporated in a housing 501. Images can be displayed on the display portion 503. Here, the housing 501 is supported by a stand 505.

The television set 500 can be operated by an operation switch of the housing 501 or a separate remote controller 510. Channels can be switched and volume can be controlled with operation keys 509 of the remote controller 510, whereby an image displayed on the display portion 503 can be controlled. The remote controller 510 may be provided with a display portion 507 for displaying data output from the remote controller 510.

Note that the television set 500 is provided with a receiver, a modem, and the like. With the use of the receiver, general television broadcasting can be received. Moreover, when the television set 500 is connected to a communication network with or without wires via the modem, one-way (from a sender to a receiver) or two-way (between a sender and a receiver or between receivers) information communication can be performed.

Figure 11B:
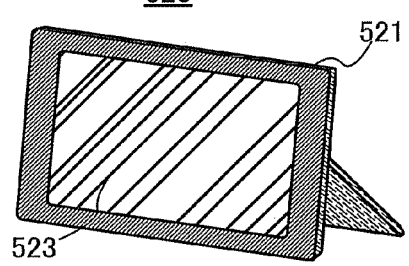

FIG. 11B illustrates an example of a digital photo frame. For example, a display portion 523 is incorporated in a housing 521 of a digital photo frame 520. The display portion 523 can display a variety of images. For example, the display portion 523 can display data of an image taken with a digital camera or the like and function as a normal photo frame.

Note that the digital photo frame 520 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 520. For example, a memory storing data of an image taken with a digital camera is inserted into the recording medium insertion portion of the digital photo frame and the image data is imported, whereby the imported image data can be displayed on the display portion 523.

The digital photo frame 520 may have a structure capable of wirelessly transmitting and receiving data. The structure may be employed in which desired image data is transferred wirelessly to be displayed.

Figure 11C:
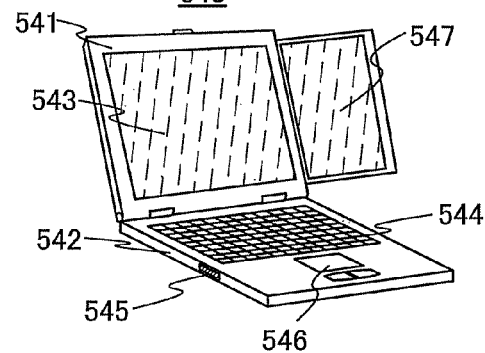

FIG. 11C is a perspective view illustrating an example of a portable computer.

In a portable computer 540 of FIG. 11C, a top housing 541 having a display portion 543 and a bottom housing 542 having a keyboard 544 can overlap with each other by closing a hinge unit which connects the top housing 541 and the bottom housing 542. The portable computer of FIG. 11C can be convenient for carrying, and in the case of using the keyboard for input, the hinge unit is opened and the user can input looking at the display portion 543.

The bottom housing 542 has a pointing device 546 with which input can be performed, in addition to the keyboard 544. When the display portion 543 is a touch screen, input can be performed by touching part of the display portion 543. The bottom housing 542 includes an arithmetic function portion such as a CPU or hard disk. In addition, the bottom housing 542 has an external connection port 545 into which another device, for example, a communication cable compliant with communication standards of a USB is inserted.

The top housing 541 further includes a display portion 547 which can be kept in the top housing 541 by being slid therein. Thus, a large display screen can be realized. In addition, the user can adjust the orientation of a screen of the display portion 547 which can be kept in the top housing 541. When the display portion 547 which can be kept in the top housing 541 is a touch screen, input can be performed by touching part of the display portion 547 which can be kept in the top housing 541.

In addition, the portable computer 540 in FIG. 11C can be provided with a receiver and the like and can receive television broadcasting to display an image on the display portion. The user can watch television broadcasting when the whole screen of the display portion 547 is exposed by sliding the display portion 547 and the angle of the screen is adjusted while the hinge unit which connects the top housing 541 and the bottom housing 542 is kept closed. In this case, the hinge unit is not opened and display is not performed on the display portion 543. In addition, start up of only a circuit for displaying television broadcasting is performed. Therefore, power consumption can be the minimum, which is useful for the portable computer whose battery capacity is limited.

The display device described in the above embodiment is used in a display portion of a semiconductor device such as an electronic device, whereby a highly reliable semiconductor device can be provided.

This embodiment can be combined with any of the other embodiments disclosed in this specification as appropriate.

This application is based on Japanese Patent Application serial no. 2011-028004 filed with Japan Patent Office on Feb. 11, 2011, the entire contents of which are hereby incorporated by reference.

What is claimed is:

1. A light-emitting device comprising:
a wiring;
an insulating layer on and in contact with a first portion of the wiring;
a first light-emitting element comprising:
a first electrode layer, wherein the first electrode layer and the wiring are provided on a same insulating surface;
a first light-emitting layer over the first electrode layer; and
a second electrode layer over the first light-emitting layer, wherein an end portion of the second electrode layer is provided on and in direct contact with a second portion of the wiring;
an organic compound layer covering the insulating layer; and
a conductive layer covering the organic compound layer, wherein the second electrode layer and the conductive layer comprise a same material,
wherein the second portion of the wiring is overlapped with the insulating layer at least partly, and
wherein the end portion of the second electrode layer is overlapped with the insulating layer, the organic compound layer and the conductive layer.

2. The light-emitting device according to claim 1, wherein the insulating layer has an inversely tapered shape.

3. The light-emitting device according to claim 1, further comprising:
a second light-emitting element comprising:
a third electrode layer;
a second light-emitting layer over the third electrode layer; and
a fourth electrode layer over the second light-emitting layer,
wherein the wiring is provided between the first electrode layer and the third electrode layer,
wherein the fourth electrode layer is provided on and in direct contact with a third portion of the wiring, and
wherein the third portion of the wiring is overlapped with the insulating layer at least partly.

4. The light-emitting device according to claim 3, wherein the first light-emitting layer and the second light-emitting layer comprise a same material.

5. The light-emitting device according to claim 1, wherein the second electrode layer has a light-transmitting property.

6. A lighting device comprising the light-emitting device according to claim 1.

7. A display device comprising the light-emitting device according to claim 1.

8. A light-emitting device comprising:
a wiring;
a first insulating layer on and in contact with a first portion of the wiring;
a first light-emitting element comprising:
a first electrode layer, wherein the first electrode layer and the wiring are provided on a same insulating surface;
a first light-emitting layer over the first electrode layer; and
a second electrode layer over the first light-emitting layer, wherein an end portion of the second electrode layer is provided on and in direct contact with a second portion of the wiring;
an organic compound layer covering the first insulating layer; and a conductive layer covering the organic compound layer, wherein the second electrode layer and the conductive layer comprise a same material;

a second light-emitting element comprising:
- a third electrode layer, wherein the second electrode layer of the first light-emitting element is provided on and in contact with a third portion of the third electrode layer;
- a second light-emitting layer over the third electrode layer; and
- a fourth electrode layer over the second light-emitting layer;

a second insulating layer on and in contact with a fourth portion of the third electrode layer, wherein the second portion of the wiring is overlapped with the first insulating layer at least partly, wherein the third portion of the third electrode layer is overlapped with the second insulating layer at least partly, and wherein the end portion of the second electrode layer is overlapped with the first insulating layer, the organic compound layer, and the conductive layer.

9. The light-emitting device according to claim 8, wherein the first insulating layer has an inversely tapered shape.

10. The light-emitting device according to claim 8, wherein the first light-emitting layer and the second light-emitting layer comprise a same material.

11. The light-emitting device according to claim 8, wherein the second electrode layer has a light-transmitting property.

12. A lighting device comprising the light-emitting device according to claim 8.

13. A display device comprising the light-emitting device according to claim 8.

14. A method for manufacturing a light-emitting device, the method comprising the steps of:
- forming a first electrode layer and a wiring on a same insulating surface;
- forming an insulating layer on and in contact with a first portion of the wiring;
- forming a light-emitting layer over the first electrode layer and an organic compound layer covering the insulating layer; and
- forming a second electrode layer over the light-emitting layer and a conductive layer covering the organic compound layer, so that an end portion of the second electrode layer is overlapped with the insulating layer, the organic compound layer, and the conductive layer, wherein the second electrode layer is formed on and in direct contact with a second portion of the wiring, and wherein the second portion of the wiring is overlapped with the insulating layer at least partly.

15. The method for manufacturing a light-emitting device according to claim 14, wherein the insulating layer is formed so as to have an inversely tapered shape.

16. The method for manufacturing a light-emitting device according to claim 14, wherein the second electrode layer has a light-transmitting property.

17. The light-emitting device according to claim 1, wherein the organic compound layer is in direct contact with the wiring.

18. The light-emitting device according to claim 8, wherein the organic compound layer is in direct contact with the wiring.

19. The method for manufacturing a light-emitting device according to claim 14, wherein the light-emitting layer is in direct contact with the wiring.

* * * * *

UNITED STATES PATENT AND TRADEMARK OFFICE
CERTIFICATE OF CORRECTION

| | | |
|---|---|---|
| PATENT NO. | : 8,928,018 B2 | Page 1 of 1 |
| APPLICATION NO. | : 13/369892 | |
| DATED | : January 6, 2015 | |
| INVENTOR(S) | : Hisao Ikeda et al. | |

It is certified that error appears in the above-identified patent and that said Letters Patent is hereby corrected as shown below:

In the Specification:

Column 1, Line 28; Change "organic. EL" to --organic EL--.

Column 2, Line 27; Change "which, causes" to --which causes--.

Column 6, Line 63; Change "feinted" to --formed--.

Column 13, Line 44; Change "limitation, on" to --limitation on--.

Column 25, Line 10 to 11; Change ")-N-phenylamino]" to --)-N'-phenylamino]--.

Column 26, Line 45; Change "PV PTPDMA," to --PVTPA, PTPDMA,--.

Column 27, Line 6; Change "compound; a" to --compound, a--.

Column 27, Line 42; Change "6'-difluorophenyppyridinato-N," to --6'-difluorophenyl)pyridinato-N,--.

Column 27, Line 44; Change "N,C$^{2'}$}(abbreviation:" to --N,C$^{2'}$} iridium(III)picolinate (abbreviation:--.

Column 27, Line 52; Change "iridium(II)" to --iridium(III)--.

Column 27, Line 56; Change "iridium(II)" to --iridium(III)--.

Column 28, Line 16; Change "porphyrinplatinum(III)" to --porphyrinplatinum(II)--.

Column 28, Line 40; Change "beryllium(H)" to --beryllium(II)--.

Column 29, Line 27 to 28; Change "(p-bu-tyl-phenyl)" to --(p-butylphenyl)--.

Column 29, Line 39; Change "diphenyl amino)" to --diphenylamino)--.

Column 30, Line 22; Change "thereof; such" to --thereof, such--.

Column 32, Line 66; Change "as, lithium" to --as lithium--.

Column 33, Line 51; Change "faulted" to --formed--.

In the Claims:

Column 36, Line 26, Claim 1; Change "layer and" to --layer, and--.

Signed and Sealed this
Twenty-sixth Day of May, 2015

Michelle K. Lee
*Director of the United States Patent and Trademark Office*